(12) United States Patent
Kang et al.

(10) Patent No.: US 12,328,989 B2
(45) Date of Patent: *Jun. 10, 2025

(54) DISPLAY PANEL AND DISPLAY APPARATUS INCLUDING THE SAME

(71) Applicant: SAMSUNG DISPLAY CO., LTD., Yongin-si (KR)

(72) Inventors: Juhoon Kang, Yongin-si (KR); Gunhee Kim, Yongin-si (KR); Hyunho Kim, Yongin-si (KR); Hyungkeun Park, Yongin-si (KR); Donghwan Shim, Yongin-si (KR); Taehoon Yang, Yongin-si (KR); Joohee Jeon, Yongin-si (KR); Sunyoung Jung, Yongin-si (KR); Chungsock Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/492,752

(22) Filed: Oct. 23, 2023

(65) Prior Publication Data

US 2024/0057386 A1 Feb. 15, 2024

Related U.S. Application Data

(63) Continuation of application No. 17/444,160, filed on Jul. 30, 2021, now Pat. No. 11,800,751.

(30) Foreign Application Priority Data

Aug. 24, 2020 (KR) ........................ 10-2020-0106430

(51) Int. Cl.
*H10K 59/12* (2023.01)
*H10K 50/844* (2023.01)
(Continued)

(52) U.S. Cl.
CPC ....... *H10K 59/1213* (2023.02); *H10K 50/844* (2023.02); *H10K 59/1216* (2023.02); *H10K 59/65* (2023.02)

(58) Field of Classification Search
CPC .......... H10K 59/1213; H10K 59/1216; H10K 59/65; H10K 50/844
(Continued)

(56) References Cited

U.S. PATENT DOCUMENTS 11,800,751 B2 * 10/2023 Kang ................. H10K 59/1216
2018/0366586 A1 12/2018 Son et al.
(Continued)

FOREIGN PATENT DOCUMENTS

| CN | 110047897 A | 7/2019 |
|---|---|---|
| CN | 111028692 A | 4/2020 |

(Continued)

*Primary Examiner* — Phuc T Dang
(74) *Attorney, Agent, or Firm* — Womble Bond Dickinson (US) LLP

(57) ABSTRACT

A display panel includes: a substrate including a main display area, a component area, and a peripheral area; an auxiliary display element in the component area; an auxiliary pixel circuit in the peripheral area and comprising an auxiliary thin-film transistor and an auxiliary storage capacitor; a transparent connection line connecting the auxiliary display element to the auxiliary pixel circuit; and a first organic insulating layer and a second organic insulating layer that are stacked between the substrate and the auxiliary display element in the component area, wherein the first organic insulating layer is between the transparent connection line and the auxiliary display element, and a refractive index of the first organic insulating layer is between a refractive index of the transparent connection line and a refractive index of the second organic insulating layer.

20 Claims, 14 Drawing Sheets

(51) Int. Cl.
*H10K 59/121* (2023.01)
*H10K 59/65* (2023.01)

(58) Field of Classification Search
USPC .......................................................... 257/40
See application file for complete search history.

(56) References Cited

U.S. PATENT DOCUMENTS

| | | |
|---|---|---|
| 2020/0235187 A1 | 7/2020 | Bae et al. |
| 2020/0258967 A1 | 8/2020 | Kim et al. |
| 2021/0191552 A1* | 6/2021 | Bok ..................... G06F 1/1643 |

FOREIGN PATENT DOCUMENTS

| | | | | |
|---|---|---|---|---|
| CN | 111063719 A | | 4/2020 | |
| CN | 111180494 A | | 5/2020 | |
| KR | 10-2020-0037029 A | | 4/2020 | |
| KR | 20220019160 A | * | 2/2022 | ........... H10K 59/131 |
| KR | 20220021081 A | * | 2/2022 | ......... H10K 59/1216 |

* cited by examiner

DISPLAY PANEL AND DISPLAY APPARATUS INCLUDING THE SAME

CROSS-REFERENCE TO RELATED APPLICATIONS

This application is a continuation of U.S. Patent Application Ser. No. 17/444,160, now U.S. Pat. No. 11,800,751, filed Jul. 30, 2021, which claims priority to and the benefit of Korean Patent Application No. 10-2020-0106430, filed Aug. 24, 2020, the entire content of both of which is incorporated herein by reference.

BACKGROUND

1. Field

Aspects of one or more embodiments relate to a display panel and a display apparatus including the display panel.

2. Description of Related Art

The usage of display apparatuses has steadily become more diversified and expanded, with the development of technology allowing for display apparatuses to become relatively thinner and lighter over time.

As display apparatuses are used in various ways, there may be various methods of designing the shape of a display apparatus, and also, functions that may be combined with or linked to display apparatuses have increased.

The above information disclosed in this Background section is only for enhancement of understanding of the background and therefore the information discussed in this Background section does not necessarily constitute prior art.

SUMMARY

Aspects of one or more embodiments relate to a display panel and a display apparatus including the display panel, and for example, to a display panel having an extended display area so that an image may be displayed even in an area where a component as an electronic element is arranged, and a display apparatus including the display panel.

Aspects of one or more embodiments include a display panel including an extended display area so that an image may be displayed even in an area where a component as an electronic element is arranged, and a display apparatus including the display panel. However, the above characteristics are merely an examples, and thus do not limit the scope of embodiments according to the present disclosure.

Additional aspects will be set forth in part in the description which follows and, in part, will be apparent from the description, or may be learned by practice of the embodiments of the present disclosure.

According to some embodiments of the present disclosure, a display panel includes a substrate including a main display area, a component area, and a peripheral area, an auxiliary display element arranged in the component area, an auxiliary pixel circuit arranged in the peripheral area and including an auxiliary thin-film transistor and an auxiliary storage capacitor, a transparent connection line connecting the auxiliary display element and the auxiliary pixel circuit to each other, and a first organic insulating layer and a second organic insulating layer that are stacked between the substrate and the auxiliary display element in the component area, wherein the first organic insulating layer is arranged between the transparent connection line and the auxiliary display element, and a refractive index of the first organic insulating layer has a value between a refractive index of the transparent connection line and a refractive index of the second organic insulating layer.

According to some embodiments, a difference between the refractive index of the transparent connection line and the refractive index of the first organic insulating layer may be 0.45 or less.

According to some embodiments, the refractive index of the first organic insulating layer may be greater than the refractive index of the second organic insulating layer.

According to some embodiments, the first organic insulating layer may include a photosensitive polyimide, and the second organic insulating layer may include a siloxane-based resin.

According to some embodiments, the display panel may further include a metal connection line connecting the transparent connection line and the auxiliary display element to each other. The metal connection line and the transparent connection line may be arranged on the same layer.

According to some embodiments, the display panel may further include a metal connection line connecting the transparent connection line and the auxiliary display element to each other. The metal connection line and an upper electrode of the auxiliary storage capacitor may be arranged on the same layer.

According to some embodiments, the display panel may further include an inorganic insulating layer arranged on the substrate. The inorganic insulating layer may include a hole or groove corresponding to the component area.

According to some embodiments, the transparent connection line may be arranged inside the hole or groove of the inorganic insulating layer. The first organic insulating layer may fill the hole or groove of the inorganic insulating layer and may be arranged on an entire surface of the substrate.

According to some embodiments, the first organic insulating layer may be arranged inside the hole or groove of the inorganic insulating layer, and a thickness of the first organic insulating layer may be less than a depth of the hole or groove of the inorganic insulating layer.

According to some embodiments, the second organic insulating layer may fill the hole or groove of the inorganic insulating layer, and the transparent connection line may be arranged on the second organic insulating layer.

According to some embodiments, the display panel may further include a thin-film encapsulation layer which is arranged above the auxiliary display element and in which a first inorganic encapsulation layer, an organic encapsulation layer, and a second inorganic encapsulation layer are stacked.

According to some embodiments, the display panel may further include a first additional inorganic encapsulation layer arranged between the first inorganic encapsulation layer and the organic encapsulation layer. A refractive index of the first additional inorganic encapsulation layer may have a value of between a refractive index of the first inorganic encapsulation layer and a refractive index of the organic encapsulation layer.

According to some embodiments, the display panel may further include a buffer layer arranged between the substrate and the auxiliary thin-film transistor, and a compensation layer arranged between the substrate and the buffer layer. The buffer layer may include silicon nitride, and the compensation layer may include silicon oxynitride.

According to some embodiments, the display panel may further include an anti-reflection film arranged on a lower surface of the substrate.

According to some embodiments of the present disclosure, a display apparatus includes a display panel including a main display area including a plurality of main sub-pixels, a component area including a plurality of sub-pixels, and a peripheral area, and a component arranged to correspond to the component area below the display panel, wherein the display panel includes a substrate, an auxiliary display element arranged in the component area on the substrate, an auxiliary pixel circuit arranged on the substrate in the peripheral area and including an auxiliary thin-film transistor and an auxiliary storage capacitor, a transparent connection line connecting the auxiliary display element and the auxiliary pixel circuit to each other, and a first organic insulating layer and a second organic insulating layer that are stacked between the substrate and the auxiliary display element in the component area, wherein the first organic insulating layer is arranged between the transparent connection line and the auxiliary display element, and a refractive index of the first organic insulating layer has a value between a refractive index of the transparent connection line and a refractive index of the second organic insulating layer.

According to some embodiments, a difference between the refractive index of the transparent connection line and the refractive index of the first organic insulating layer may be 0.45 or less.

According to some embodiments, the refractive index of the first organic insulating layer may be greater than the refractive index of the second organic insulating layer.

According to some embodiments, the first organic insulating layer may include a photosensitive polyimide, and the second organic insulating layer may include a siloxane-based resin.

According to some embodiments, the display apparatus may further include an inorganic insulating layer arranged on the substrate. The inorganic insulating layer may include a hole or groove corresponding to the component area.

According to some embodiments, the component may include an image pickup device.

BRIEF DESCRIPTION OF THE DRAWINGS

The above and other aspects, features, and characteristics of some embodiments of the disclosure will be more apparent from the following description taken in conjunction with the accompanying drawings, in which.

DETAILED DESCRIPTION

Figure 1:
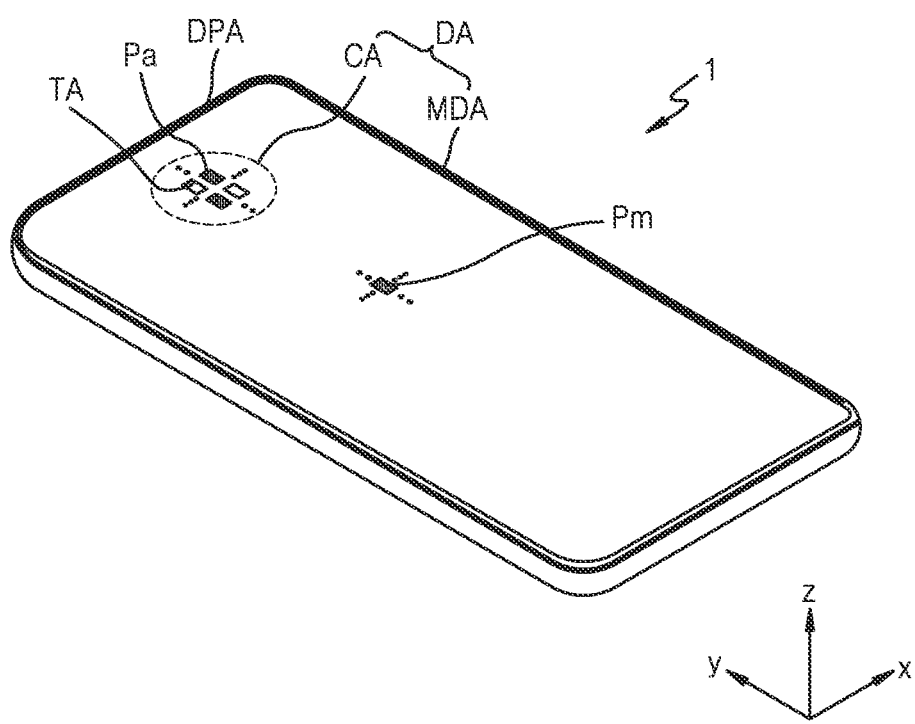
FIG. 1 is a perspective view schematically illustrating a display apparatus according to some embodiments.

Reference will now be made in more detail to aspects of some embodiments, which are illustrated in the accompanying drawings, wherein like reference numerals refer to like elements throughout the present disclosure. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of embodiments according to the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

It will be understood that when a layer, region, or element is referred to as being "formed on" another layer, area, or element, it can be directly or indirectly formed on the other layer, region, or element. That is, for example, one or more intervening layers, regions, or elements may be present therebetween. Sizes of elements in the drawings may be exaggerated for convenience of explanation. In other words, because sizes and thicknesses of elements in the drawings are arbitrarily illustrated for convenience of explanation, the following embodiments are not limited thereto.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

FIG. 1 is a perspective view schematically illustrating a display apparatus 1 according to some embodiments.

Referring to FIG. 1, the display apparatus 1 may include a display area DA and a peripheral area DPA outside the display area DA. The display area DA may include a component area CA and a main display area MDA at least partially surrounding the component area CA. In other words, each of the component area CA and the main display area MDA may display images individually or together. The peripheral area DPA may be a type of non-display area in which display elements are not arranged (e.g., a bezel area). The display area DA may be entirely surrounded by the peripheral area DPA.

FIG. 1 shows that one component area CA is located in the main display area MDA. According to some embodiments, the display apparatus 1 may include two or more component areas CA, and shapes and sizes of the plurality of component areas CA may be different from each other. When viewed from a direction substantially perpendicular to an upper surface of the display apparatus 1 (e.g., when viewed in a plan view, or a view normal to a plane of the display surface), the component area CA may have various shapes such as a circle, an ellipse, a polygon such as a square, a star shape, or a diamond shape. That is, the shape of the component area CA may vary, and may have any suitable shape according to the design of the display apparatus 1. In FIG. 1, the component area CA is arranged in the upper center (in the +y direction) of the main display area MDA having a substantially rectangular shape when viewed from a direction substantially perpendicular to the top surface of the display apparatus 1. However, the component area CA may be arranged on one side of the rectangular main display area MDA, for example, on the upper right or upper left.

The display apparatus 1 may display images using a plurality of main subpixels Pm arranged in the main display area MDA and a plurality of auxiliary subpixels Pa arranged in the component area CA.

As will be described in more detail below with reference to FIG. 2, a component 40 as an electronic element may be arranged under the display panel corresponding to the component area CA. The component 40 may include a camera using infrared or visible light and may include an image pickup device. In some embodiments, the component 40 may include a solar cell, a flash, an illuminance sensor, a proximity sensor, and an iris sensor. In some embodiments, the component 40 may have a function of receiving sound. In order to minimize the limitation of the function of the component 40, the component area CA may include a transmission area TA through which light and/or sound that is output from the component 40 to the outside or traveling toward the component 40 from the outside may pass. That is, the component area CA may include a transmission area TA configured to enable signals such as light, sound, or other wireless spectrum, to be transmitted through the transmission area TA (e.g., from within the display apparatus 1, or from an external device). In the case of a display panel and a display apparatus including the display panel according to some embodiments, when light is transmitted through the component area CA, the light transmittance may be about 10% or more, for example, 40% or more, 25% or more, 50% or more, 85% or more, or 90% or more.

The plurality of auxiliary subpixels Pa may be arranged in the component area CA. Each of the plurality of auxiliary subpixels Pa may emit light to display images. An image displayed in the component area CA may be an auxiliary image and may have a lower resolution than an image displayed in the main display area MDA. In other words, the component area CA may include the transmission area TA through which light and sound may transmit, and when no subpixels are arranged on the transmission area TA, the number of auxiliary subpixels Pa that may be arranged per unit area may be less than the number of main subpixels Pm arranged per unit area in the main display area MDA.

Figure 2A:
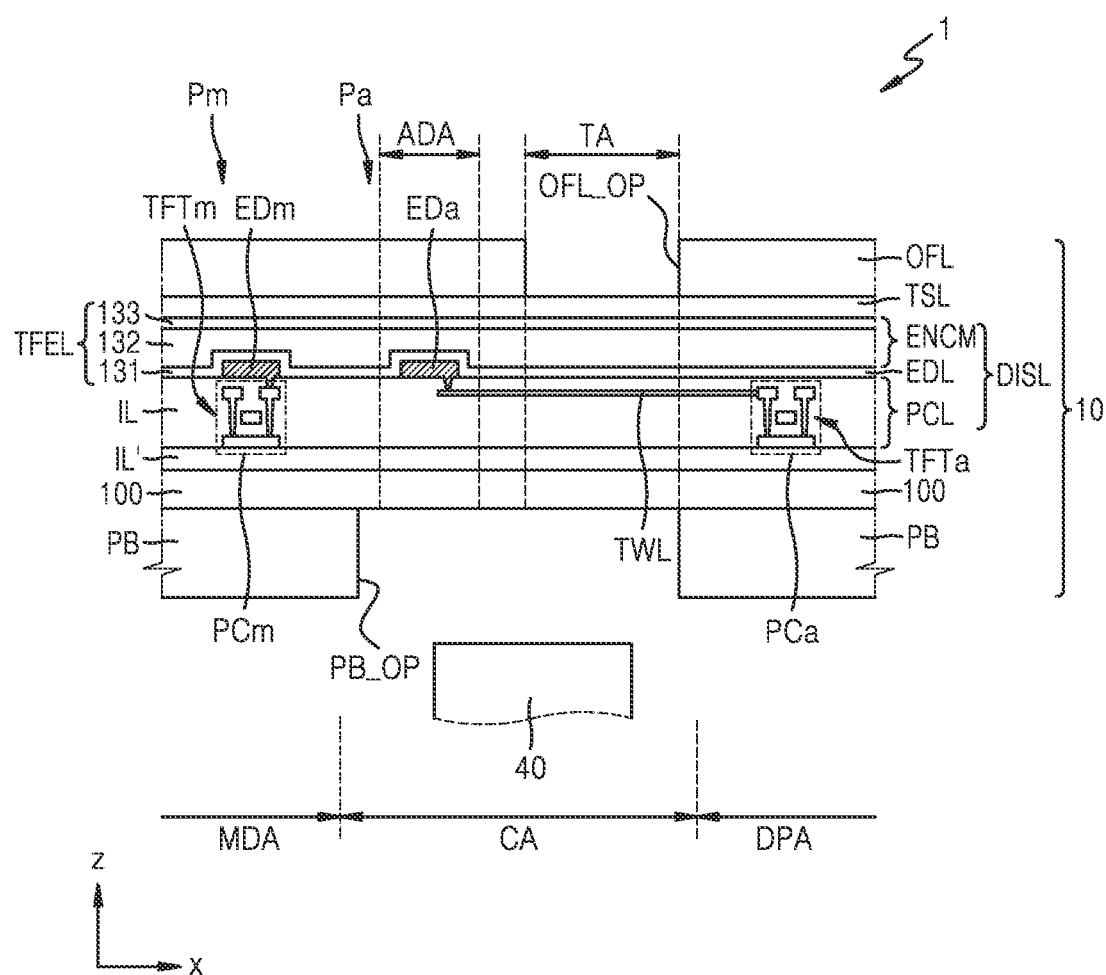
FIG. 2A is a cross-sectional view schematically illustrating part of a display apparatus according to some embodiments.
Figure 2B:
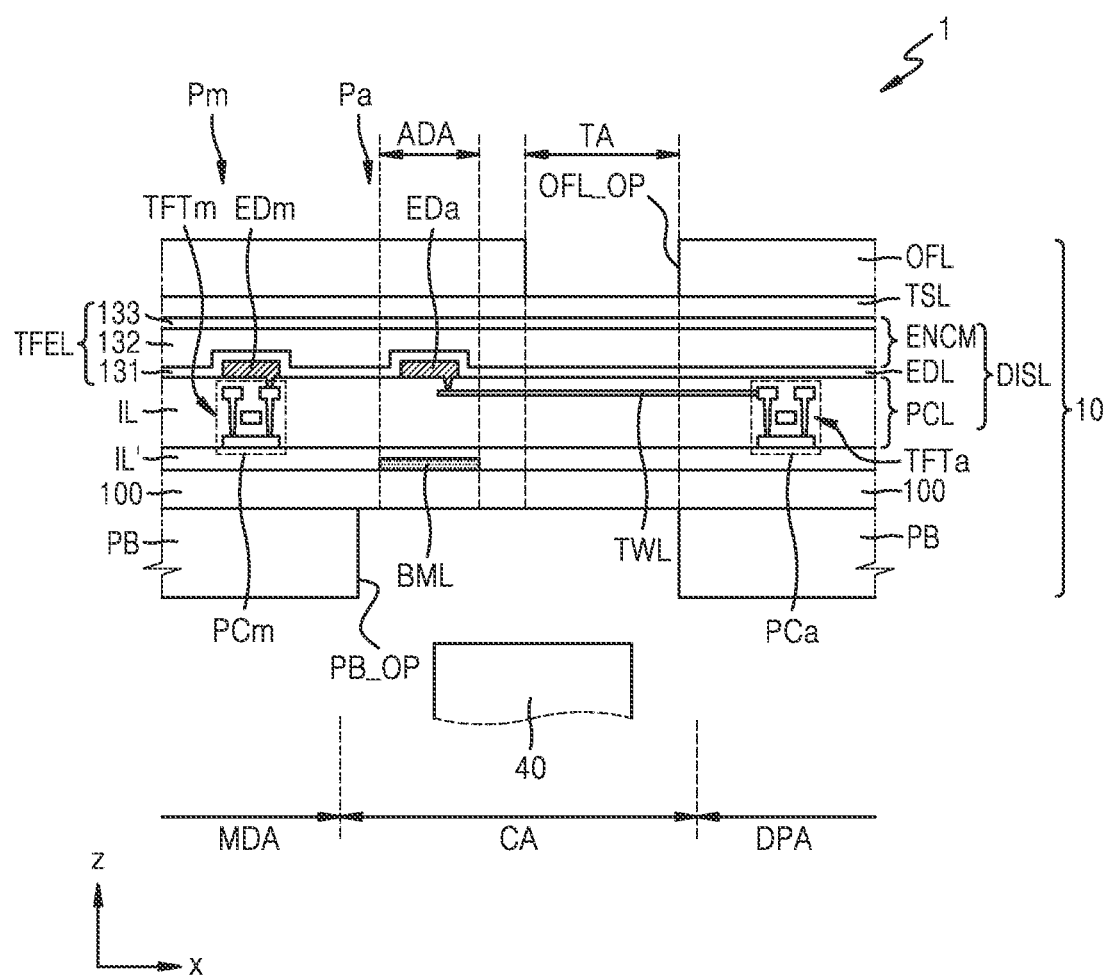
FIG. 2B is a cross-sectional view schematically illustrating part of a display apparatus according to some embodiments.

FIGS. 2A and 2B are cross-sectional views illustrating part of a cross-section of a display apparatus 1 according to some embodiments.

Referring to FIG. 2A, the display apparatus 1 may include a display panel 10 and a component 40 overlapping the display panel 10. A cover window may be further arranged on the display panel 10 to protect the display panel 10 (e.g., from external impact, etc.).

The display panel 10 may include the component area CA, which is an area overlapping the component 40, and the main display area MDA in which a main image is displayed. The display panel 10 may include a substrate 100, a display layer DISL on the substrate 100, a touch screen layer TSL, an optical functional layer OFL, and a panel protection member PB arranged under the substrate 100.

The display layer DISL may include a circuit layer PCL including thin-film transistors TFTm and TFTa, a display element layer EDL including light-emitting elements EDm and EDa as display elements, and an encapsulation member ENCM such as a thin-film encapsulation layer TFEL or an encapsulation substrate. Insulation layers IL and IL' may be arranged within the display layer DISL and between the substrate 100 and the display layer DISL.

The substrate 100 may include an insulating material such as glass, quartz, or polymer resin. The substrate 100 may be a rigid substrate or a flexible substrate that is bendable, foldable, or rollable.

A main pixel circuit PCm and a main light-emitting device Edm connected thereto may be arranged in the main display area MDA of the display panel 10. The main pixel circuit PCm may include at least one thin-film transistor TFTm and may control emission of the main light-emitting device EDm. A main sub-pixel Pm may be implemented by emission of the main light-emitting device EDm.

An auxiliary light-emitting device EDa may be arranged in the component area CA of the display panel 10 to implement an auxiliary sub-pixel Pa. According to some embodiments, an auxiliary pixel circuit PCa for driving the auxiliary light-emitting device EDa may not be arranged in the component area CA, but may be arranged in the peripheral area DPA, which is a non-display area. According to some embodiments, the auxiliary pixel circuit PCa may be arranged in part of the main display area MDA or between the main display area MDA and the component area CA, and various modifications may be made. In other words, the auxiliary pixel circuit PCa may be arranged such that it does not overlap the auxiliary light-emitting device EDa.

The auxiliary pixel circuit PCa may include at least one thin-film transistor TFTa, and may be electrically connected to the auxiliary light-emitting device EDa by a transparent connection line TWL. The transparent connection line TWL may include a transparent conductive material. The auxiliary pixel circuit PCa may control the emission of the auxiliary light-emitting device EDa. The auxiliary sub-pixel Pa may be implemented by emission of the auxiliary light-emitting device EDa. An area in which the auxiliary light-emitting device EDa is arranged in the component area CA may be referred to as an auxiliary display area ADA.

In addition, an area in which the auxiliary light-emitting device EDa, which is a display element, is not arranged in the component area CA may be referred to as the transmission area TA. The transmission area TA may be an area through which light/a signal emitted from the component 40 corresponding to the component area CA or light/a signal incident to the component 40 may transmit. The auxiliary display area ADA and the transmission area TA may be alternately arranged in the component area CA. The transparent connection line TWL connecting the auxiliary pixel circuit PCa to the auxiliary light-emitting device EDa may be arranged in the transmission area TA. Because the transparent connection line TWL may include a transparent conductive material having a high transmittance, the transmittance of the transmission area TA may be secured, even if the transparent connection line TWL is arranged in the transmission area TA.

According to some embodiments, because the auxiliary pixel circuit PCa is not arranged in the component area CA, the area of the transmission area TA may be secured, and thus, the light transmittance may be further improved.

The display element layer EDL may be covered with the thin-film encapsulation layer TFEL or the encapsulation substrate. In some embodiments, the thin-film encapsulation layer TFEL may include at least one inorganic encapsulation layer and at least one organic encapsulation layer, as shown in FIG. 2. According to some embodiments, the thin-film encapsulation layer TFEL may include first and second inorganic encapsulation layers 131 and 133 and an organic encapsulation layer 132 therebetween.

Each of the first inorganic encapsulation layer 131 and the second inorganic encapsulation layer 133 may include one or more inorganic insulation materials such as silicon oxide ($SiO_2$), silicon nitride ($SiN_x$), silicon oxynitride ($SiO_xN_y$), aluminum oxide ($Al_2O_3$), titanium oxide ($TiO_2$), and tantalum oxide ($Ta_2O_5$), hafnium oxide ($HfO_2$), or zinc oxide (ZnO), and may be formed by chemical vapor deposition (CVD) or the like. The organic encapsulation layer 132 may include a polymer-based material. The polymer-based material may include a silicon-based resin, an acryl-based resin, an epoxy-based resin, polyimide, polyethylene, and the like.

The first inorganic encapsulation layer 131, the organic encapsulation layer 132, and the second inorganic encapsulation layer 133 may be integrally formed to cover the main display area MDA and the component area CA.

When the display element layer EDL is sealed with the encapsulation substrate, the encapsulation substrate may be arranged to face the substrate 100 with the display element layer EDL therebetween. A gap may be between the encapsulation substrate and the display element layer EDL. The encapsulation substrate may include glass. A sealant including frit or the like may be arranged between the substrate 100 and the encapsulation substrate, and the sealant may be arranged in the aforementioned peripheral area DPA. The sealant arranged in the peripheral area DPA may surround the display area DA and prevent moisture from penetrating through the sides.

The touch screen layer TSL may obtain coordinate information according to an external input, for example, a touch event. The touch screen layer TSL may include a touch electrode and touch lines connected to the touch electrode. The touch screen layer TSL may detect an external input using a self-capacitance scheme or a mutual capacitive scheme.

The touch screen layer TSL may be formed on the thin-film encapsulation layer TFEL. In some embodiments, the touch screen layer TSL may be separately formed on the touch substrate, and then bonded to the thin-film encapsulation layer TFEL via an adhesive layer such as an optically clear adhesive (OCA). According to some embodiments, the touch screen layer TSL may be formed directly on the thin-film encapsulation layer TFEL, and in this case, the adhesive layer may not be arranged between the touch screen layer TSL and the thin-film encapsulation layer TFEL.

The optical functional layer OFL may include an anti-reflection layer. The anti-reflection layer may reduce the reflectance of light (external light) incident from the outside toward the display apparatus 1.

In some embodiments, the optical functional layer OFL may be a polarizing film. The optical functional layer OFL may include an opening OFL_OP corresponding to the transmission area TA. Accordingly, the light transmittance of the transmission area TA may be remarkably improved. A transparent material such as an optically clear resin (OCR) may be filled in the opening OFL_OP.

In some embodiments, the optical functional layer OFL may be provided as a filter plate including a black matrix and color filters.

The panel protection member PB may be attached to a lower portion of the substrate 100 and may support and protect the substrate 100. The panel protection member PB may have an opening PB_OP corresponding to the component area CA. Thus, the light transmittance of the component area CA may be improved. The panel protection member PB may include polyethylene terephthalate (PET) or polyimide (PI). An area of the component area CA may be greater than an area in which the component 40 is arranged. Thus, the area of the opening PB_OP provided in the panel protection member PB may not match the area of the component area CA.

In addition, a plurality of components 40 may be arranged in the component area CA. The plurality of components 40 may have different functions. For example, the plurality of components 40 may include at least two of a camera (an image pickup device), a solar cell, a flash, a proximity sensor, an illuminance sensor, and an iris sensor.

In FIG. 2A, a bottom metal layer BML is not arranged under the auxiliary light-emitting device EDa of the component area CA, but as shown in FIG. 2B, the display apparatus 1 according to some embodiments may include the bottom metal layer BML.

The bottom metal layer BML may be arranged between the substrate 100 and the auxiliary light-emitting device EDa so as to overlap the auxiliary light-emitting device EDa. The bottom metal layer BML may block external light from reaching the auxiliary light-emitting device EDa. Meanwhile, the bottom metal layer BML may be formed to correspond to the entire component area CA and may include a lower-hole corresponding to the transmission area TA. In this case, the lower-hole may be provided in various shapes such as polygonal, circular, or amorphous shape, and may adjust the diffraction characteristic of external light.

Figure 3A:
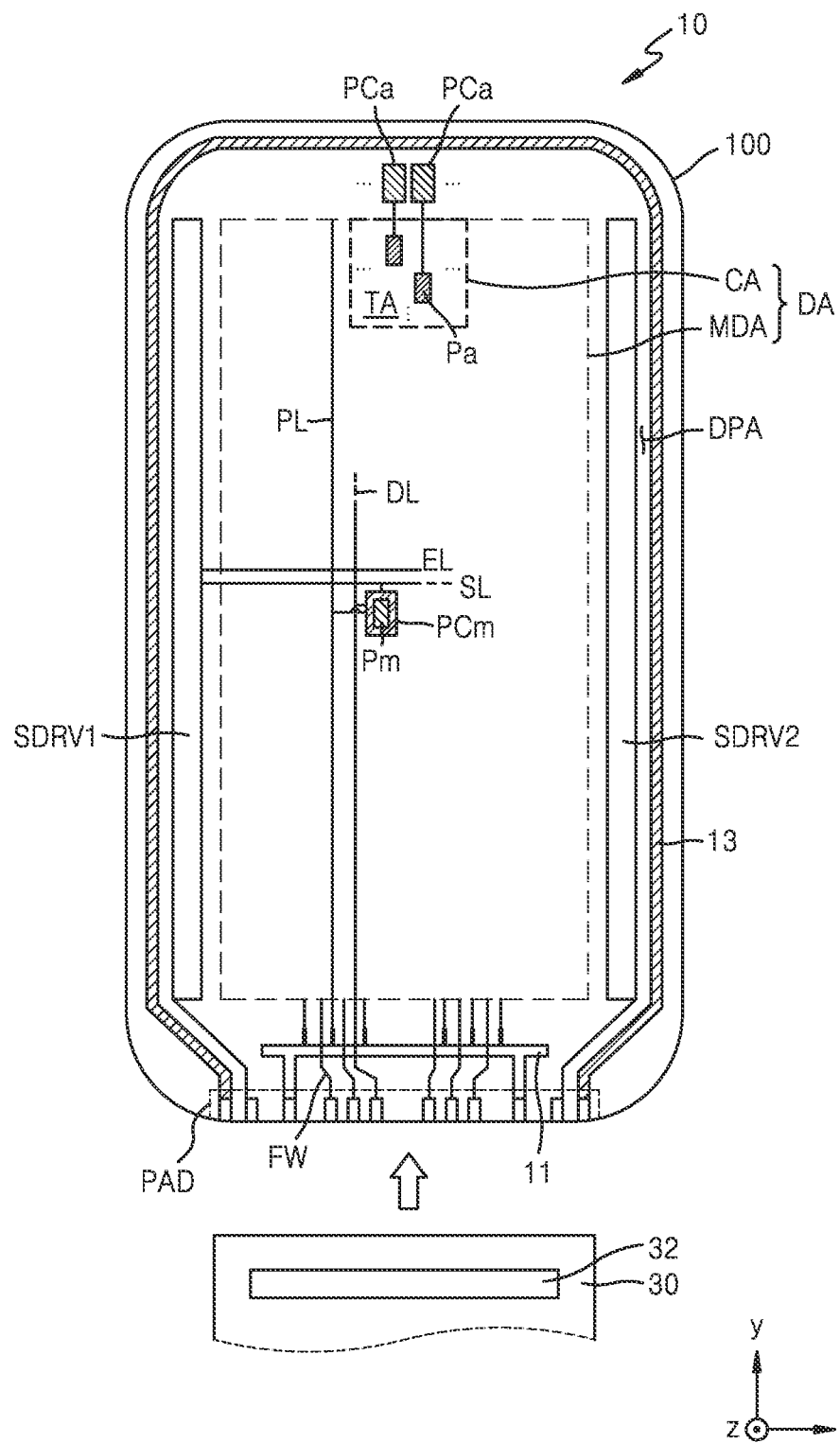
FIGS. 3A and 3B are plan views schematically illustrating a display panel 10 that may be included in the display apparatus 1 of FIG. 1, according to some embodiments.
Figure 3B:
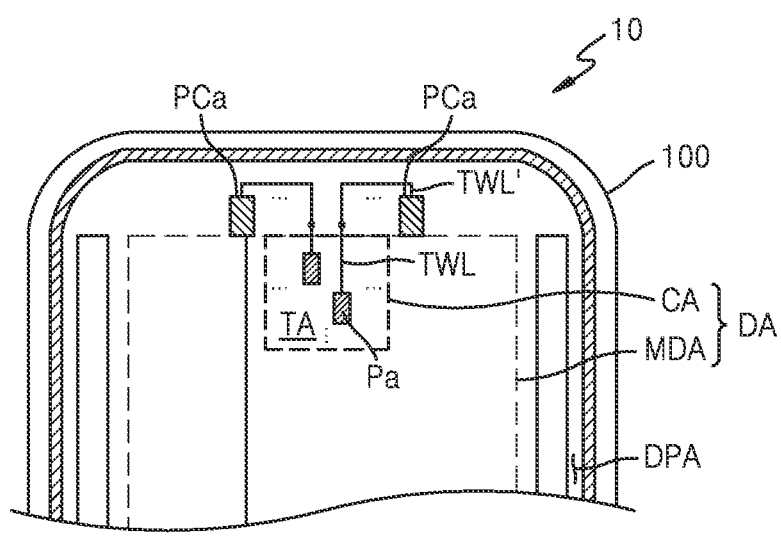

FIGS. 3A and 3B are plan views schematically illustrating a display panel 10 that may be included in the display apparatus 1 of FIG. 1, according to some embodiments.

Referring to FIG. 3A, various elements of the display panel 10 may be arranged on the substrate 100. The substrate 100 may include a display area DA and a peripheral area DPA surrounding the display area DA. The display area DA may include a main display area MDA at which main images are displayed, and a component area CA which has a transmission area TA and at which auxiliary images may be displayed. The auxiliary images may form one full image together with the main images, and the auxiliary images may be images that are independent from the main images. That is, depending on the design and use of the display apparatus 1, the main display area MDA and the component area CA may collectively display a corresponding portion of a single image, or they may be configured to display separate or independent images from each other.

A plurality of main sub-pixels Pm may be arranged in the main display area MDA. Each of the main sub-pixels Pm may be implemented as a display element such as an organic light-emitting diode (OLED). A main pixel circuit PCm driving the main sub-pixel Pm may be arranged in the main display area MDA, and the main pixel circuit PCm may be arranged to overlap the main sub-pixel Pm. For example, each main sub-pixel Pm may emit one of red light, green light, blue light, and white light. The main display area MDA may be covered with an encapsulation member and protected from ambient air or moisture.

As described above, the component area CA may be located at one side of the main display area MDA, or may be arranged inside the display area DA and surrounded by the main display area MDA. A plurality of sub-pixels Pa may be arranged in the component area CA. Each of the plurality of auxiliary sub-pixels Pa may be implemented by a display element such as an organic light-emitting diode. The auxiliary pixel circuit PCa driving the auxiliary sub-pixel Pa may be arranged in the peripheral area DPA close to the component area CA. For example, when the component area CA is arranged at an upper side of the display area DA, the auxiliary pixel circuit PCa may be arranged at an upper side of the peripheral area DPA. The auxiliary pixel circuit PCa and the display element implementing the auxiliary sub-pixel Pa may be connected to each other by a transparent connection line TWL extending in the y direction.

For example, each auxiliary sub-pixel Pa may emit one of red light, green light, blue light, and white light. The component area CA may be covered with an encapsulation member and protected from ambient air, moisture, or other contaminants.

Meanwhile, the component area CA may have a transmission area TA. The transmission area TA may be arranged to surround the plurality of auxiliary sub-pixels Pa. In some embodiments, the transmission area TA may be arranged in a grid shape with the plurality of auxiliary sub-pixels Pa.

Because the component area CA has the transmission area TA, a resolution of the component area CA may be lower than that of the main display area MDA. For example, the resolution of the component area CA may be about ½, ⅜, ⅓, ¼, ⅖, ⅛, ⅑, or 1/16 of the resolution of the main display area MDA. For example, the resolution of the main display area MDA may be about 400 ppi or more, and the resolution of the component area CA may be about 200 ppi or about 100 ppi.

The pixel circuits driving the main and auxiliary sub-pixels Pm and Pa may be electrically connected to outer circuits arranged in the peripheral area DPA, respectively. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the pixel circuits PCm driving the main sub-pixel Pm through a main scan line SLm. The first scan driving circuit SDRV1 may apply an emission control signal to each pixel circuit through a main emission control line EL. The second scan driving circuit SDRV2 may be located at the opposite side of the first scan driving circuit SDRV1 with respect to the main display area MDA, and may be approximately parallel to the first scan driving circuit SDRV1. Some of the pixel circuits of the main sub-pixels Pm of the main display area MDA may be electrically connected to the first scan driving circuit SDRV1, and the other ones may be electrically connected to the second scan driving circuit SDRV2.

The terminal portion PAD may be arranged at one side of the substrate 100. The terminal portion PAD may be exposed by not being covered by an insulating layer, and may be connected to a display circuit board 30. A display driver 32 may be arranged on the display circuit board 30.

The display driver 32 may generate control signals to be transmitted to the first scan driving circuit SDRV1 and the second scan driving circuit SDRV2. The display driver 32 may generate a data signal, and the generated data signal may be transmitted to the main pixel circuit PCm via a fan-out line FW and a main data line DLm connected to the fan-out line FW.

The display driver 32 may apply a driving voltage ELVDD to the driving voltage supply line 11 and apply a common voltage ELVSS to the common voltage supply line 13. The driving voltage ELVDD may be applied to the pixel circuit of the main and auxiliary sub-pixels Pm and Pa via a driving voltage line PL connected to the driving voltage supply line 11, and the common voltage ELVSS may be connected to the common voltage supply line 13 and applied to an opposite electrode of the display element.

The driving voltage supply line 11 may extend in the x direction from a lower side of the main display area MDA. The common voltage supply line 13 may have a loop shape of which one side is open, and may partially surround the main display area MDA.

FIG. 3A shows a case where there is one component area CA. However, a plurality of component areas CA may be provided. In this case, the plurality of component areas CA may be spaced apart from each other, a first camera may be arranged to correspond to one component area CA, and a second camera may be arranged to correspond to another component area CA. In some embodiments, a camera may be arranged to correspond to one component area CA, and one or more other sensors or emitters (e.g., an infrared sensor) may be arranged to correspond to other component areas CA. Shapes and sizes of the plurality of component areas CA may be different from each other.

Meanwhile, the component area CA may have a circular, elliptical, polygonal, or irregular shape. In some embodiments, the component area CA may have an octagonal shape. The component area CA may be provided in a variety of polygons, such as a square or hexagon. The component area CA may be surrounded by the main display area MDA.

In FIG. 3A, the auxiliary pixel circuit PCa is arranged adjacent to an outer side of the component area CA, but the present disclosure is not limited thereto. As shown in FIG. 3B, the auxiliary pixel circuit PCa may be arranged adjacent to an outer side of the main display area MDA. In some embodiments, the transparent connection line TWL may be connected to the auxiliary pixel circuit PCa via a metal connection line TWL'. In this case, the transparent connection line TWL may be arranged in the component area CA, and the metal connection line TWL' may be arranged in the peripheral area DPA. The transparent connection line TWL may include a transparent conductive material, and the metal connection line TWL' may include a highly conductive metal. In some embodiments, the metal connection line TWL' and the transparent connection line TWL may be arranged on the same layer. According to some embodiments, the metal connection line TWL' and the transparent connection line TWL may be arranged on different layers and connected to each other via a contact hole.

Figure 4:
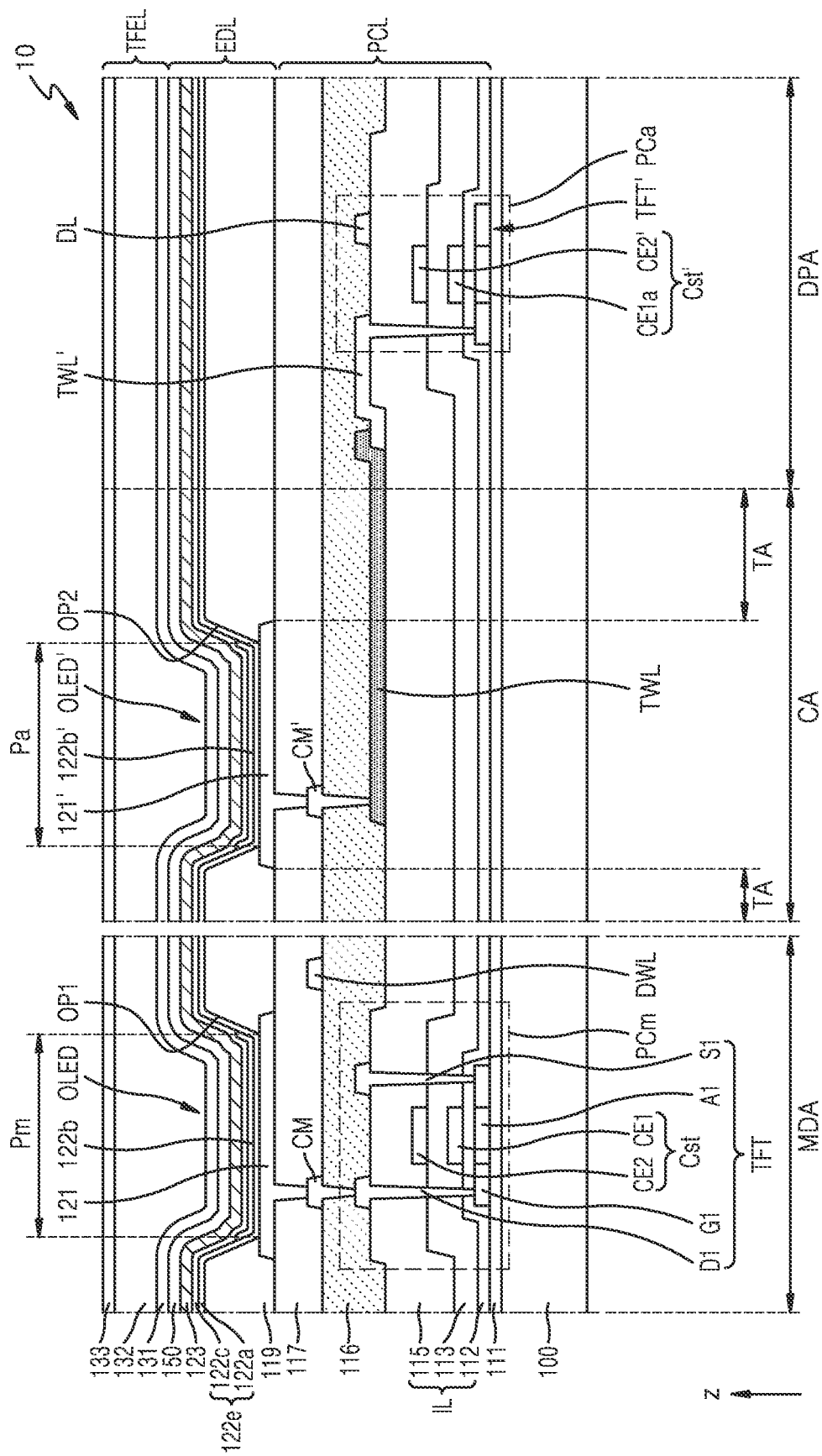
FIG. 4 is a cross-sectional view schematically illustrating part of a display panel according to some embodiments.

FIG. 4 is a schematic cross-sectional view illustrating part of a display panel 10 and part of the main display area MDA, the component area CA, and the peripheral area DPA.

Referring to FIG. 4, the main sub-pixel Pm is arranged in the main display area MDA, and the component area CA includes the auxiliary sub-pixel Pa and the transmission area TA. In the main display area MDA, the main pixel circuit PCm including a main thin-film transistor TFT and a main storage capacitor Cst, and a main organic light-emitting diode OLED as a main display element connected to the main pixel circuit PCm. An auxiliary organic light-emitting diode OLED' may be arranged as an auxiliary display element in the component area CA. The auxiliary pixel circuit PCa including an auxiliary thin-film transistor TFT' and an auxiliary storage capacitor Cst' may be arranged in the peripheral area DPA. Meanwhile, the transparent connection line TWL connecting the auxiliary pixel circuit PCa and the auxiliary organic light-emitting diode OLED' to each other may be arranged in the component area CA and the peripheral area DPA.

In the component area CA, a first organic insulating layer 116 and a second organic insulating layer 117 may be stacked between the substrate 100 and the auxiliary organic light-emitting diode OLED', and the first organic insulating layer 116 may be arranged on the transparent connection line TWL.

According to some embodiments, a refractive index n1 of the first organic insulating layer 116 may have a value of between a refractive index n0 of the transparent connection line TWL and a refractive index n2 of the second organic insulating layer 117. For example, the refractive index n1 of the first organic insulating layer 116 may be greater than the refractive index n2 of the second organic insulating layer 117 and less than the refractive index n0 of the transparent connection line TWL. (n0>n1>n2)

In some embodiments, the refractive index n0 of the transparent connection line TWL may be provided at about 1.9 to about 2.1 for a wavelength of 550 nm. The refractive index n1 of the first organic insulating layer 116 may be provided at about 1.6 to about 1.9 for a wavelength of 550 nm. The refractive index n2 of the second organic insulating layer 117 may be provided at about 1.4 to about 1.6. In some embodiments, a difference between the refractive index n0 of the transparent connection line TWL and the refractive index n1 of the first organic insulating layer 116 may be about 0.45 or less.

In some embodiments, a light transmittance of the second organic insulating layer 117 may be greater than a light transmittance of the first organic insulating layer 116. In some embodiments, the flatness of an upper surface of the second organic insulating layer 117 may be relatively better than a flatness of an upper surface of the first organic insulating layer 116. That is, the upper surface of the second organic insulating layer 117 may be flatter than the upper surface of the first organic insulating layer 116.

As the difference in refractive index between the transparent connection line TWL and the insulating layers arranged thereon increases, the light diffraction intensity due to the transparent connection line TWL may increase. According to some embodiments, by selecting a material in which a difference between a refractive index of the first organic insulating layer 116 arranged on the transparent connection line TWL and a refractive index of the transparent connection line TWL is small, the aforementioned light diffraction phenomenon may be minimized or relatively reduced. In addition, when only the first organic insulating layer 116 is present in the component area CA, light transmittance and flatness and flatness may be reduced. Therefore, the second organic insulating layer 117, which has relatively better light transmittance and flatness than the first organic insulating layer 116, may be employed so that the light diffraction may be minimized or relatively reduced and the light transmittance and flatness may be relatively improved.

In some embodiments, an inorganic insulating layer may be formed between the transparent connection line TWL and the first organic insulating layer 116. In general, the inorganic insulating layer is formed to be thinner than the organic insulating layer and does not affect the optical path, and thus, the light diffraction phenomenon due to the inorganic insulating layer may be insignificant.

Meanwhile, according to some embodiments, an organic light-emitting diode is used as a display element, but according to some embodiments, an inorganic light-emitting device or a quantum dot light-emitting device may be used as the display element.

Hereinafter, a structure in which elements included in the display panel 10 are stacked will be described. The display panel 10 may be provided by stacking the substrate 100, a buffer layer 111, a circuit layer PCL, and a display element layer EDL.

The substrate 100 may include an insulating material such as glass, quartz, or polymer resin. The substrate 100 may be a rigid substrate or a flexible substrate that is bendable, foldable, or rollable.

The buffer layer 111 may be positioned on the substrate 100 to reduce or block the penetration of foreign matter, moisture, or ambient air from the lower portion of the substrate 100, and may provide a flat surface on the substrate 100. The buffer layer 111 may include an inorganic material such as an oxide or nitride, an organic material, or an organic-inorganic composite, and may include a single layer or multiple layers of an inorganic material and an organic material. A barrier layer that blocks the penetration of ambient air may be further included between the substrate 100 and the buffer layer 111. In some embodiments, the buffer layer 111 may include silicon oxide ($SiO_2$) or silicon nitride ($SiN_x$).

The circuit layer PCL may be arranged on the buffer layer 111, and may include main and auxiliary pixel circuits PCm and PCa, a first gate insulating layer 112, a second gate insulating layer 113, an interlayer insulating layer 115, the first organic insulating layer 116, and the second organic insulating layer 117. The main pixel circuit PCm may include a main thin-film transistor TFT and a main storage capacitor Cst, and the auxiliary pixel circuit PCa may include an auxiliary thin-film transistor TFT' and an auxiliary storage capacitor Cst'.

The main thin-film transistor TFT and the auxiliary thin-film transistor TFT' may be arranged on the buffer layer 111. The main thin-film transistor TFT may include a first semiconductor layer A1, a first gate electrode G1, a first source electrode S1, and a first drain electrode D1. The main thin-film transistor TFT may be connected to the main organic light-emitting diode OLED to drive the main organic light-emitting diode OLED. The auxiliary thin-film transistor TFT' may be connected to the auxiliary organic light-emitting diode OLED' to drive the auxiliary organic light-emitting diode OLED'. The auxiliary thin-film transistor TFT' has a structure similar to a structure of the main thin-film transistor TFT, and thus, only descriptions of the main thin-film transistor TFT will be given, in replacement of descriptions of the auxiliary thin-film transistor TFT'.

The first semiconductor layer A1 may be arranged on the buffer layer 111 and may include polysilicon. According to some embodiments, the first semiconductor layer A1 may include amorphous silicon. According to some embodiments, the first semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel area and a source area and a drain area doped with impurities.

The first gate insulating layer 112 may be provided to cover the first semiconductor layer A1. The first gate insulating layer 112 may include an inorganic insulating material such as $SiO_2$, $SiN_x$, silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The first gate insulating layer 112 may include a single layer or multiple layers including the above-described inorganic insulating material.

The first gate electrode G1 may be arranged on the first gate insulating layer 112 so as to overlap the first semiconductor layer A1. The first gate electrode G1 may include molybdenum (Mo), aluminum (Al), copper (Cu), titanium (Ti), and the like, and may include a single layer or multiple layers. For example, the first gate electrode G1 may be a single Mo layer.

The second gate insulating layer 113 may be provided to cover the first gate electrode G1. The second gate insulating layer 113 may include an inorganic insulating material such as $SiO_2$, $SiN_x$, $SiO_xN_y$, $Al_2O_3$, $TiO_2$, $Ta_2O_5$, $HfO_2$, or ZnO. The second gate insulating layer 113 may include a single layer or multiple layers including the above-described inorganic insulating material.

An upper electrode CE2 of the main storage capacitor Cst and an upper electrode CE2' of the auxiliary storage capacitor Cst' may be arranged above the second gate insulating layer 113.

In the main display area MDA, the upper electrode CE2 of the main storage capacitor Cst may overlap the first gate electrode G1 below the upper electrode CE2 of the main storage capacitor Cst. The first gate electrode G1 and the upper electrode CE2 overlapping each other with the second gate insulating layer 113 therebetween may form the main storage capacitor Cst. The first gate electrode G1 may be a lower electrode CE1 of the main storage capacitor Cst.

In the peripheral area DPA, the upper electrode CE2' of the auxiliary storage capacitor Cst' may overlap a gate electrode of the auxiliary thin-film transistor TFT' below the upper electrode CE2' of the auxiliary storage capacitor Cst'. The gate electrode of the auxiliary thin-film transistor TFT' may include the lower electrode CE1' of the auxiliary storage capacitor Cst'.

Each of the upper electrodes CE2 and CE2' may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may have a single or multi-layer structure including the above material.

The interlayer insulating layer 115 may be formed to cover the upper electrodes CE2 and CE2'. The interlayer insulating layer 115 may include $SiO_x$, $SiN_x$, $SiO_xN_y$, $Al_2O_3$, $TiO_2$, $Ta_2O_5$, $HfO_2$, ZnO, or the like. The interlayer insulating layer 115 may have a single or multi-layer structure including the above inorganic insulating material.

A source electrode S1 and a drain electrode D1 may be arranged on the interlayer insulating layer 115. Each of the source electrode S1 and the drain electrode D1 may include a conductive material including Mo, Al, Cu, Ti, or the like, and may include a single layer or multiple layers including the conductive material. For example, each of the source electrode S1 and the drain electrode D1 may have a multi-layered structure of a Ti layer, an Al layer, and another Ti layer.

A transparent connection line TWL connected to the auxiliary pixel circuit PCa may be arranged on the interlayer insulating layer 115. The transparent connection line TWL may extend from the peripheral area DPA to the component area CA and connect the auxiliary organic light-emitting diode OLED' and the auxiliary pixel circuit PCa to each other. In addition, a data line DL may be arranged above the interlayer insulating layer 115.

The transparent connection line TWL may be connected to the metal connection line TWL'. The metal connection line TWL' may be arranged in the peripheral area DPA and connected to the auxiliary pixel circuit PCa, for example, the auxiliary thin-film transistor TFT'. The transparent connection line TWL may be arranged in the transmission area TA of the component area CA. An end of the transparent connection line TWL may cover an end of the metal connection line TWL'.

The metal connection line TWL' may include a conductive material including Mo, Al, Cu, Ti, etc., and may be formed as a multilayer or a single layer including the above material. In some embodiments, the metal connection line TWL' and the data line DL may include a same material on the same layer. However, the present disclosure is not limited thereto. The metal connection line TWL' may be arranged on various layers. For example, the metal connection line TWL' and a first pixel electrode 121 may be arranged on the same layer. In some embodiments, the metal connection line TWL' and the first gate electrode G1 of the main thin-film transistor TFT may be arranged on the same layer. Alternatively, the metal connection line TWL' and the upper electrode CE2 of the main storage capacitor Cst may be arranged on the same layer.

The transparent connection line TWL may include a transparent conductive material. For example, the transparent connection line TWL may include a transparent conducting oxide (TCO). The transparent connection line TWL may include a conductive oxide including indium tin oxide (ITO), indium zinc oxide (IZO), zinc oxide (ZnO), indium oxide ($In_2O_3$), indium gallium oxide (IGO), or aluminum zinc oxide (AZO). The transparent connection line TWL may have a refractive index of about 1.9 to about 2.1.

The metal connection line TWL' may have a higher conductivity than the transparent connection line TWL. Because the metal connection line TWL' is arranged in the peripheral area DPA, light transmittance needs not be secured, and thus, a material with lower light transmittance but higher conductivity than the transparent connection line TWL may be used.

The first organic insulating layer 116 may be arranged to cover the source electrodes S1 and S2, the drain electrodes D1 and D2, and the transparent connection line TWL.

The first organic insulating layer 116 may include a material having a small difference in refractive index from the transparent connection line TWL. The first organic insulating layer 116 may include a material having a refractive index of about 1.6 to about 1.9. For example, the first organic insulating layer 116 may include photosensitive PI, PI, polystyrene (PS), polycarbonate (PC), and acrylic polymer. In some embodiments, the first organic insulating layer 116 may include high refractive index nanoparticles such as TiO$_2$ or ZrO$_2$ in an organic polymer. The connection electrodes CM and CM' and various lines DWL may be arranged above the first organic insulating layer 116, which may enable relatively high integration.

The second organic insulating layer 117 may be arranged on the first organic insulating layer 116. The second organic insulating layer 117 may have a flat top surface so that the first pixel electrode 121 and the second pixel electrode 121' arranged on the second organic insulating layer 117 may be formed flat. The second organic insulating layer 117 may include a siloxane-based organic material having high light transmittance and flatness. The siloxane-based organic material may include hexamethyldisiloxane, octamethyltrisiloxane, decamethyltetrasiloxane, dodecamethylpentasiloxane, and polydimethylsiloxanes.

In some embodiments, the second organic insulating material may include, for example, benzocyclobutene (BCB), PI, hexamethyldisiloxane (HMDSO), poly(methyl methacrylate) (PMMA), or a general-purpose polymer, such as polystyrene (PS), a polymer derivate having a phenol-based group, an acryl-based polymer, an imide-based polymer, an aryl-ether-based polymer, an amide-based polymer, a fluorine-based polymer, a p-xylene-based polymer, or a vinyl alcohol-based polymer.

The main and auxiliary organic light-emitting diodes OLED and OLED' may be arranged on the second organic insulating layer 117. The first and second pixel electrodes 121 and 121' of the main and auxiliary organic light-emitting diodes OLED and OLED' may be connected to the main and auxiliary pixel circuits PCm and PCa through the connection electrodes CM and CM' arranged on the first organic insulating layer 116.

Each of the first pixel electrode 121 and the second pixel electrode 121' may include a conductive oxide including ITO, IZO, ZnO, In$_2$O$_3$, IGO, or AZO. Each of the first pixel electrode 121 and the second pixel electrode 121' may include a reflective film including silver (Ag), magnesium (Mg), Al, platinum (Pt), palladium (Pd), gold (Au), nickel (Ni), neodymium (Nd), Iridium (Ir), chromium (Cr), or any compounds thereof. For example, the first pixel electrode 121 and the second pixel electrode 121' may have a structure having films including ITO, IZO, ZnO, or In$_2$O$_3$ above/below the above-described reflective film. In this case, each of the first pixel electrode 121 and the second pixel electrode 121' may have a stacked structure of ITO, Ag, and another ITO.

A pixel-defining layer 119 may cover edges of each of the first pixel electrode 121 and the second pixel electrode 121' on the second organic insulating layer 117, and may include a first opening OP1 and a second opening OP2 respectively exposing the central portions of the first pixel electrode 121 and the second pixel electrode 121'. The first opening OP1 and the second opening OP2 may define emission areas of the main and auxiliary organic light-emitting diodes OLED and OLED', that is, sizes and shapes of the main and auxiliary sub-pixels Pm and Pa.

The pixel-defining layer 119 may increase a distance between the edges of the first and second pixel electrodes 121 and 121' and an opposite electrode 123 above the first and second pixel electrodes 121 and 121', thereby preventing arcs from occurring at the edges of the first and second pixel electrodes 121 and 121'. The pixel-defining layer 119 may include an organic insulating material such as PI, polyamide, acrylic resin, BCB, HMDSO, and phenol resin, and may be formed by a method such as spin coating.

Inside the first opening OP1 and the second opening OP2 of the pixel-defining layer 119, a first emission layer 122$b$ and a second emission layer 122$b'$ respectively formed to correspond to the first pixel electrode 121 and the second pixel electrode 121' may be arranged. Each of the first emission layer 122$b$ and the second emission layer 122$b'$ may include a polymer material or a low molecular weight material, and may emit one of red light, green light, blue light, and white light.

An organic functional layer 122$e$ may be arranged above and/or below the first emission layer 122$b$ and the second emission layer 122$b'$. The organic functional layer 122$e$ may include a first functional layer 122$a$ and/or a second functional layer 122$c$. The first functional layer 122$a$ or the second functional layer 122$c$ may be omitted.

The first functional layer 122$a$ may be arranged under the first emission layer 122$b$ and the second emission layer 122$b'$. The first functional layer 122$a$ may be a single layer or multiple layers including an organic material. The first functional layer 122$a$ may be a single hole transport layer (HTL). In some embodiments, the first functional layer 122$a$ may include a hole injection layer (HIL) and the HTL. The first functional layer 122$a$ may be integrally formed to correspond to the main and auxiliary organic light-emitting diodes OLED and OLED' respectively included in the main display area MDA and the component area CA.

The second functional layer 122$c$ may be arranged on the first emission layer 122$b$ and the second emission layer 122$b'$. The second functional layer 122$c$ may be a single layer or multiple layers including an organic material. The second functional layer 122$c$ may include an electron transport layer (ETL) and/or an electron injection layer (EIL). The second functional layer 122$c$ may be integrally formed to correspond to the main and auxiliary organic light-emitting diodes OLED and OLED' respectively included in the main display area MDA and the component area CA.

The opposite electrode 123 may be arranged on the second functional layer 122$c$. The opposite electrode 123 may include a conductive material having a low work function. For example, the opposite electrode 123 may include a (semi-)transparent layer including silver (Ag), magnesium (Mg), Al, Pt, Pd, Au, Ni, neodymium (Nd), iridium (Ir)., chromium (Cr), lithium (Li), Ca, or any alloys thereof. In some embodiments, the opposite electrode 123 may further include a layer such as ITO, IZO, ZnO or In$_2$O$_3$ on the (semi-)transparent layer including the above-described material. The opposite electrode 123 may be integrally formed to correspond to the main and auxiliary organic light-emitting diodes OLED and OLED' respectively included in the main display area MDA and the component area CA.

Layers from the first pixel electrode 121 to the opposite electrode 123 formed in the main display area MDA may form the main organic light-emitting diode OLED. Layers from the second pixel electrode 121' formed in the component area CA to the opposite electrode 123' may form the auxiliary organic light-emitting diode OLED'.

An upper layer 150 including an organic material may be formed on the opposite electrode 123. The upper layer 150 may be a layer provided to protect the opposite electrode 123 and increase light extraction efficiency. The upper layer 150 may include an organic material having a higher refractive index than the opposite electrode 123. In addition, the upper layer 150 may be provided by stacking layers having different refractive indices. For example, the upper layer 150 may be provided by stacking a high refractive index layer, a low refractive index layer, and another high refractive index layer. In this case, the refractive index of the high refractive index layer may be about 1.7 or more, and the refractive index of the low refractive index layer may be about 1.3 or less.

The upper layer 150 may further include lithium fluoride (LiF). In some embodiments, the upper layer 150 may further include an inorganic insulating material such as silicon oxide ($SiO_2$) and silicon nitride ($SiN_x$).

A thin-film encapsulation layer TFEL may be arranged on the upper layer 150, and the main and auxiliary organic light-emitting diodes OLED and OLED' may be sealed by the thin-film encapsulation layer TFEL. The thin-film encapsulation layer TFEL may prevent external moisture or foreign substances from penetrating into the main and auxiliary organic light-emitting diodes OLED and OLED'.

The thin-film encapsulation layer TFEL may include at least one inorganic encapsulation layer and at least one organic encapsulation layer. In this regard, FIG. 4 shows a stacked structure of a first inorganic encapsulation layer 131, an organic encapsulation layer 132, and a second inorganic encapsulation layer 133. According to some embodiments, the number of organic encapsulation layers, the number of inorganic encapsulation layers, and the stacking order may be changed.

Each of the first inorganic encapsulation layer 131 and the second inorganic encapsulation layer 133 may include one or more inorganic insulating materials such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide (ZnO), and may be formed by chemical vapor deposition (CVD) or the like. The organic encapsulation layer 132 may include a polymer-based material. The polymer-based material may include a silicon-based resin, an acryl-based resin, an epoxy-based resin, PI, polyethylene, and the like. The first inorganic encapsulation layer 131, the organic encapsulation layer 132, and the second inorganic encapsulation layer 133 may be integrally formed to cover the main display area MDA and the component area CA.

Figure 5:
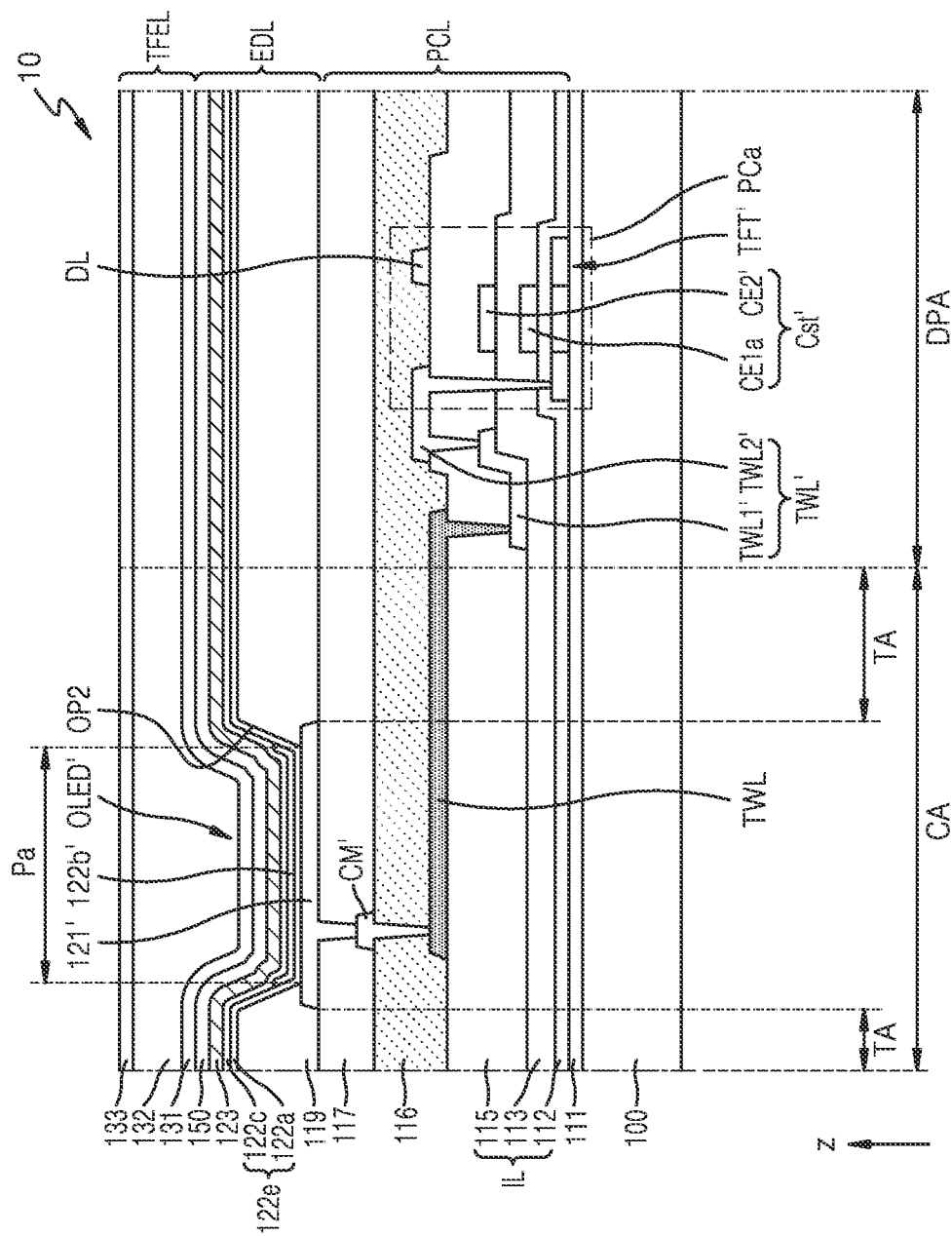
FIG. 5 is a cross-sectional view schematically illustrating part of a display panel according to some embodiments.
Figure 6:
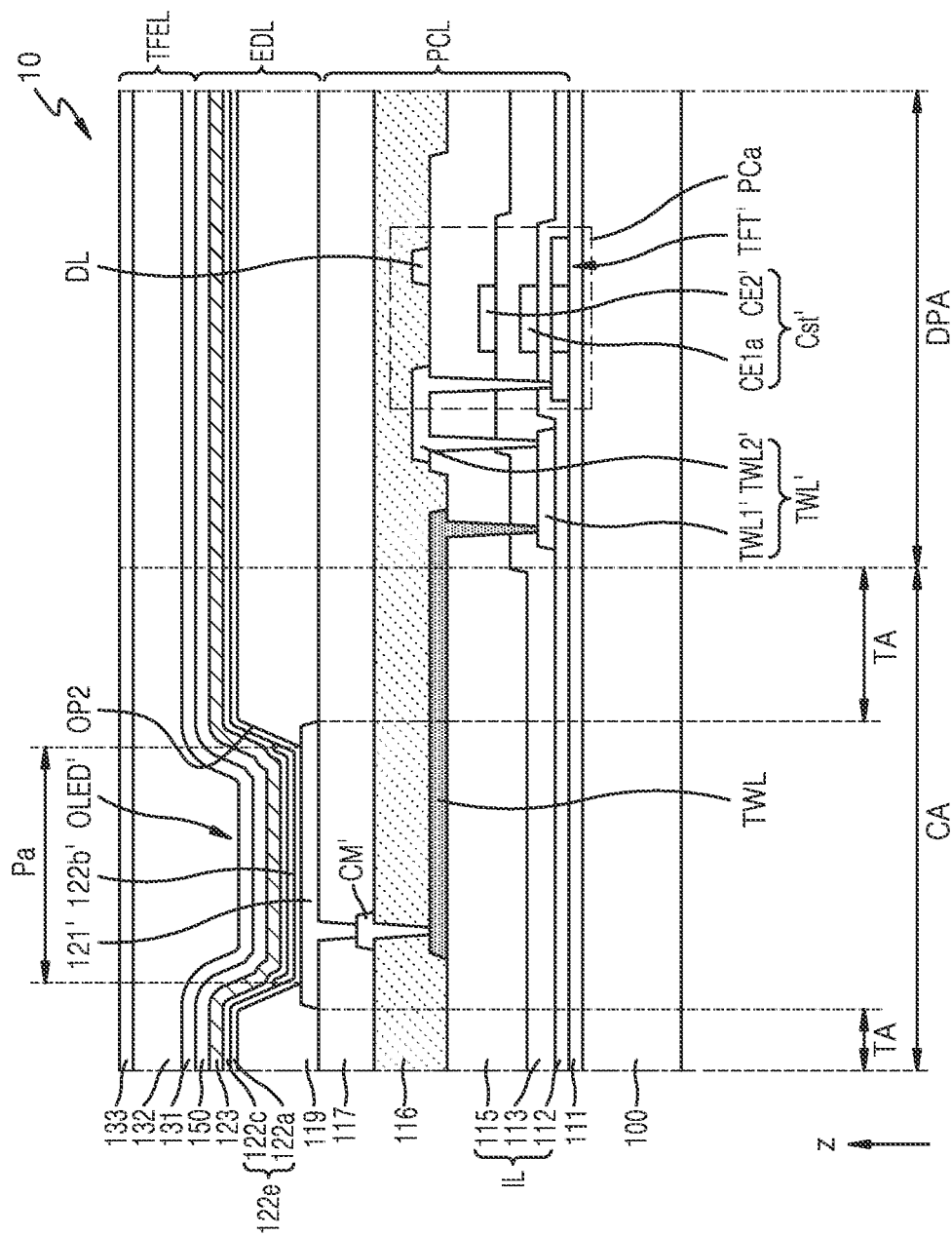
FIG. 6 is a cross-sectional view schematically illustrating part of a display panel according to some embodiments.

FIGS. 5 and 6 are cross-sectional views schematically illustrating part of a display panel 10 according to some embodiments. For example, the component area CA of the display panel 10 and the peripheral area DPA therearound are shown. In FIGS. 5 and 6, the same reference symbols as those of FIG. 4 denote the same, and thus, redundant descriptions thereof will be omitted.

Referring to FIGS. 5 and 6, the auxiliary organic light-emitting diode OLED' may be arranged as an auxiliary display element in the component area CA of the display panel 10, and the auxiliary pixel circuit PCa including the auxiliary thin-film transistor TFT' and the auxiliary storage capacitor Cst' may be arranged in the peripheral area DPA. Meanwhile, the transparent connection line TWL connecting the auxiliary pixel circuit PCa and the auxiliary organic light-emitting diode OLED' to each other may be arranged in the component area CA and the peripheral area DPA.

The transparent connection line TWL may be connected to the auxiliary pixel circuit PCa via the metal connection line TWL'. The metal connection line TWL' may be arranged on various layers. In some embodiments, the metal connection line TWL' and the transparent connection line TWL may be arranged on the same layer. According to some embodiments, the metal connection line TWL' may be arranged on a layer different from a layer on which the transparent connection line TWL is arranged. In this case, the transparent connection line TWL may be connected to the metal connection line TWL' via a contact hole.

The metal connection line TWL' may include a first line TWL1' and a second line TWL2', which are arranged on different layers. As shown in FIG. 5, the first line TWL1' and the transparent connection line TWL may be arranged with the interlayer insulating layer 115 therebetween. In other words, the first line TWL1' may be arranged under the transparent connection line TWL. The first line TWL1' may be arranged on the second gate insulating layer 113. The first line TWL1' and the upper electrode CE2' of the auxiliary storage capacitor Cst' may include a same material on the same layer. The transparent connection line TWL may be connected to the first line TWL1' via a contact hole defined in the interlayer insulating layer 115.

Meanwhile, as shown in FIG. 6, the first line TWL1' and the transparent connection line TWL may be arranged with the interlayer insulating layer 115 and the second gate insulating layer 113 therebetween. The first line TWL1' may be arranged at a lower portion of the transparent connection line TWL. The first line TWL1' may be arranged on the first gate insulating layer 112. The first line TWL' and the gate electrode of the auxiliary thin-film transistor TFT' may include a same material on the same layer. The transparent connection line TWL may be connected to the first line TWL1' via a contact hole defined in the interlayer insulating layer 115 and the second gate insulating layer 113.

The second line TWL2' may be connected to the first line TWL1' and the auxiliary pixel circuit PCa. The second line TWL2' may be arranged on the interlayer insulating layer 115, and may be connected to the first line TWL1' and the auxiliary pixel circuit PCa via contact holes, respectively.

The metal connection line TWL' may include a material having a higher conductivity than the transparent connection line TWL, and may be configured in various combinations in the peripheral area DPA. The fact that the metal connection line TWL' includes lines arranged on different layers may reduce interference between lines.

Figure 7:
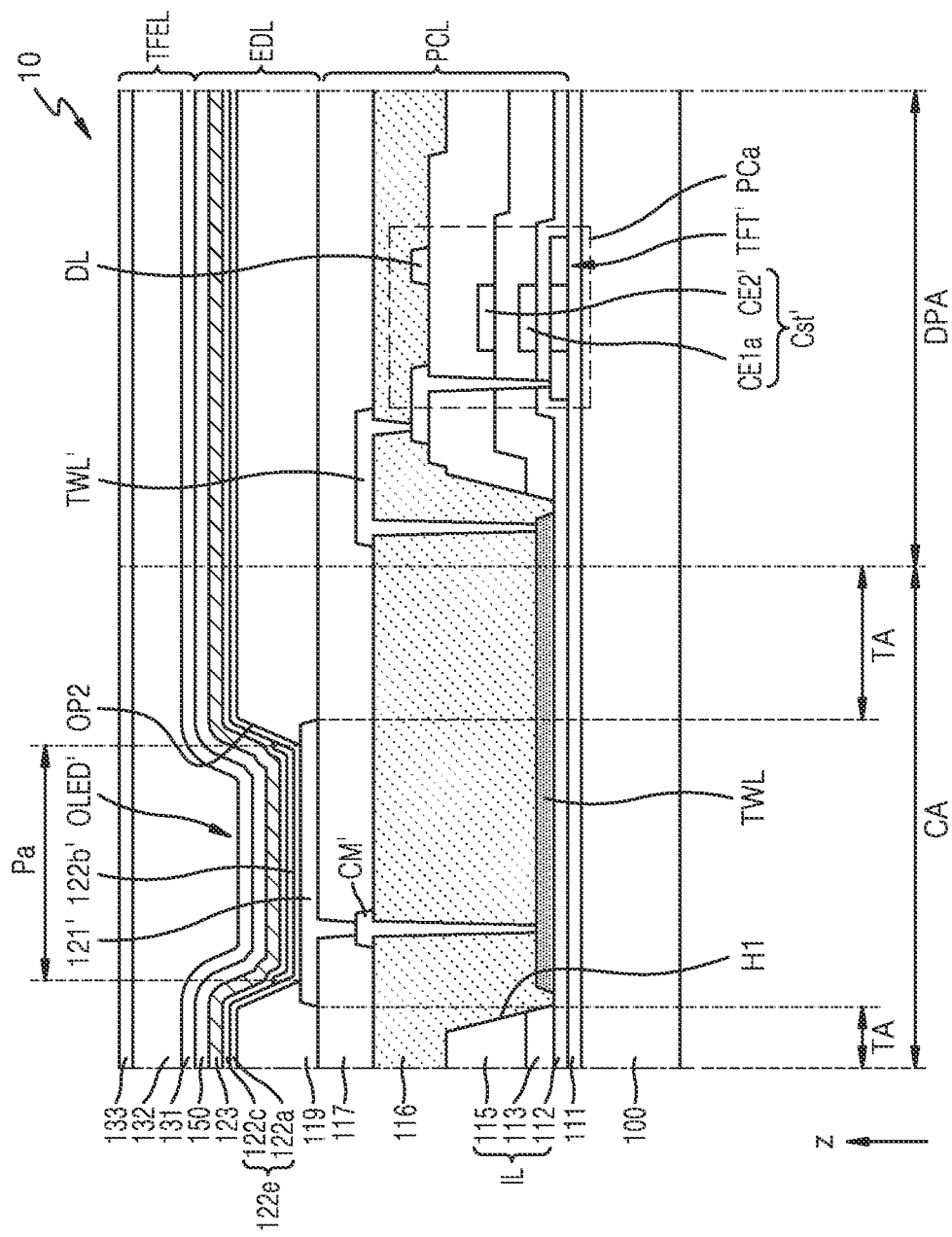
FIG. 7 is a cross-sectional view schematically illustrating part of a display panel according to some embodiments.
Figure 8:
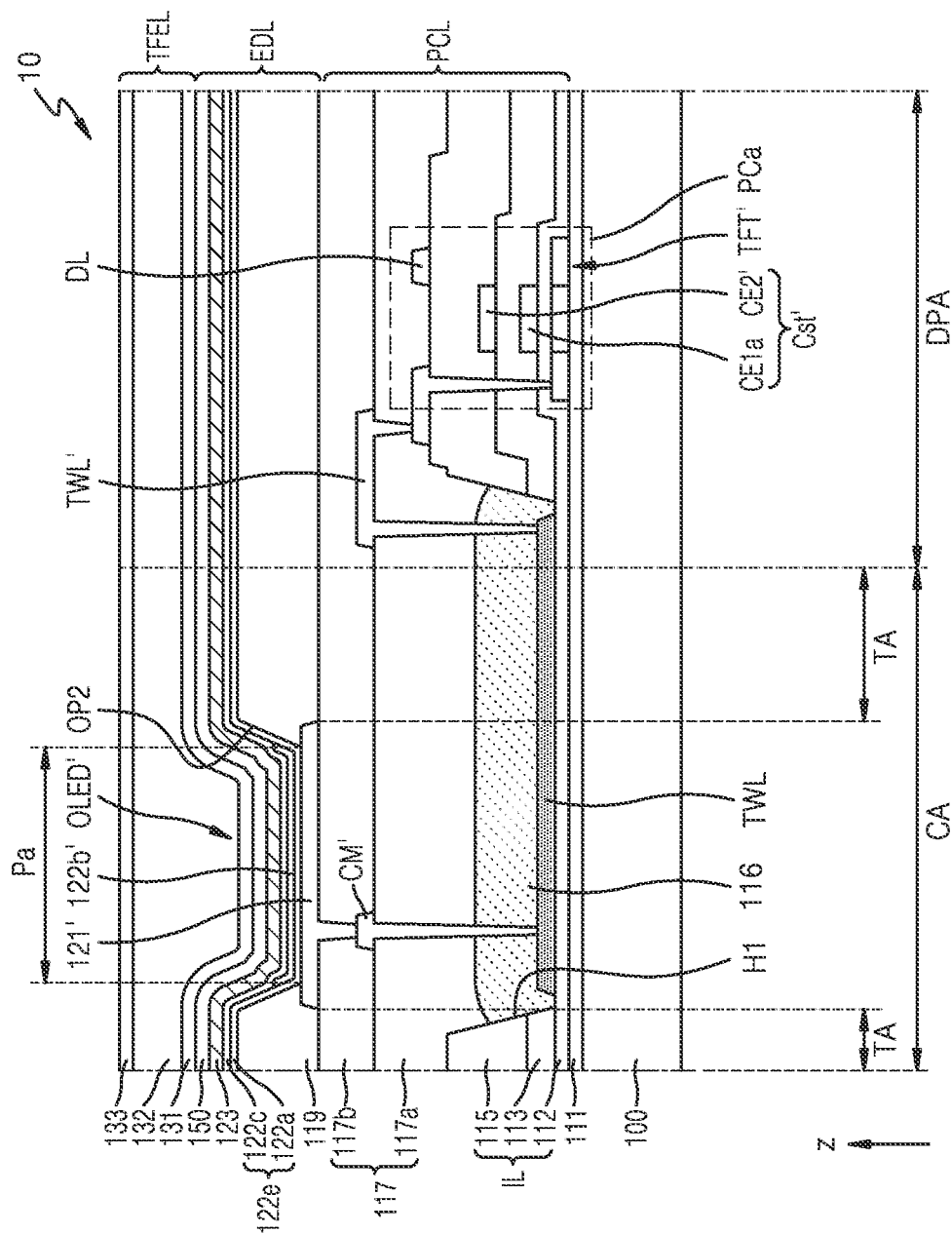
FIG. 8 is a cross-sectional view schematically illustrating part of a display panel according to some embodiments.

FIGS. 7 and 8 are cross-sectional views schematically illustrating part of a display panel 10 according to some embodiments. In FIGS. 7 and 8, the same reference symbols as those of FIG. 4 denote the same, and thus, redundant descriptions thereof will be omitted.

Referring to FIG. 7, the auxiliary organic light-emitting diode OLED' may be arranged as an auxiliary display element in the component area CA of the display panel 10, and the auxiliary pixel circuit PCa including the auxiliary thin-film transistor TFT' and the auxiliary storage capacitor Cst' may be arranged in the peripheral area DPA. Meanwhile, the transparent connection line TWL connecting the auxiliary pixel circuit PCa and the auxiliary organic light-emitting diode OLED' to each other may be arranged in the component area CA and the peripheral area DPA.

In the component area CA, a first organic insulating layer 116 and a second organic insulating layer 117 may be stacked between the substrate 100 and the auxiliary organic light-emitting diode OLED', and the first organic insulating layer 116 may be arranged on the transparent connection line TWL.

According to some embodiments, a refractive index n1 of the first organic insulating layer 116 may have a value of between a refractive index n0 of the transparent connection line TWL and a refractive index n2 of the second organic insulating layer 117. For example, the refractive index n1 of the first organic insulating layer 116 may be greater than the refractive index n2 of the second organic insulating layer 117 and less than the refractive index n0 of the transparent connection line TWL. (n0>n1>n2)

In some embodiments, the refractive index n0 of the transparent connection line TWL may be provided at about 1.9 to about 2.1 for a wavelength of 550 nm. The refractive index n1 of the first organic insulating layer 116 may be provided at about 1.6 to about 1.9 for a wavelength of 550 nm. The refractive index n2 of the second organic insulating layer 117 may be provided at about 1.4 to about 1.6. In some embodiments, a difference between the refractive index n0 of the transparent connection line TWL and the refractive index n1 of the first organic insulating layer 116 may be about 0.45 or less.

In some embodiments, a light transmittance of the second organic insulating layer 117 may be greater than a light transmittance of the first organic insulating layer 116. In some embodiments, the flatness of an upper surface of the second organic insulating layer 117 may be relatively better than a flatness of an upper surface of the first organic insulating layer 116. That is, the upper surface of the second organic insulating layer 117 may be flatter than the upper surface of the first organic insulating layer 116.

According to some embodiments, an inorganic insulating layer IL of the display panel 10 may include a hole or groove corresponding to the component area CA.

For example, when the first gate insulating layer 112, the second gate insulating layer 113, and the interlayer insulating layer 115 are collectively referred to as the inorganic insulating layer IL, the inorganic insulating layer IL may include a first hole H1 corresponding to the transmission area TA. The first hole H1 may expose a portion of the upper surface of the buffer layer 111 or the substrate 100. The first hole H1 may be formed by overlapping an opening of the first gate insulating layer 112, an opening of the second gate insulating layer 113, and an opening of the interlayer insulating layer 115, which are formed to correspond to the component area CA. These openings may be respectively formed through separate processes or may be simultaneously formed through the same process. When the openings are formed by separate processes, the inner surface of the first hole H1 may not be smooth and may have a staircase-shaped step. However, unlike the above, the inorganic insulating layer IL may include a groove other than the first hole H1 exposing the buffer layer 111. The first organic insulating layer 116 may be filled inside a hole or groove of the inorganic insulating layer IL.

According to some embodiments, the transparent connection line TWL may be provided inside the first hole H1. The transparent connection line TWL may be arranged on the buffer layer 111 in the component area CA. The transparent connection line TWL may be connected to the metal connection line TWL' arranged on the first organic insulating layer 116 via a contact hole, and may be connected to the auxiliary pixel circuit PCa via the metal connection line TWL'. The other end of the transparent connection line TWL may be connected to the connection electrode CM' via a contact hole, and the transparent connection line TWL may be connected to the second pixel electrode 121' by the connection electrode CM'.

In FIG. 7, the transparent connection line TWL and the first organic insulating layer 116 having a small difference in refractive index are arranged on the entire surface of the substrate 100, but the present disclosure is not limited thereto.

As shown in FIG. 8, the first organic insulating layer 116 may be arranged inside a hole or groove of the inorganic insulating layer IL. In other words, a thickness of the first organic insulating layer 116 may be less than a depth of the hole or groove of the inorganic insulating layer IL.

In a case where the first organic insulating layer 116 has a high refractive index, when the first organic insulating layer 116 is arranged on the entire surface of the substrate 100, a parasitic capacitor may be formed. According to some embodiments, the formation of parasitic capacitors may be minimized or relatively reduced by arranging the first organic insulating layer 116 having a high refractive index only in the component area CA in which the light diffraction intensity is to be reduced.

In FIG. 8, the second organic insulating layer 117 may include a $(2-1)^{st}$, organic insulating layer 117a and a $(2-2)^{nd}$ organic insulating layer 117b, and the connection electrode CM' and the metal connection line TWL' may be arranged between the $(2-1)^{st}$ organic insulating layer 117a and $(2-2)^{nd}$ organic insulating layer 117b.

Figure 9:
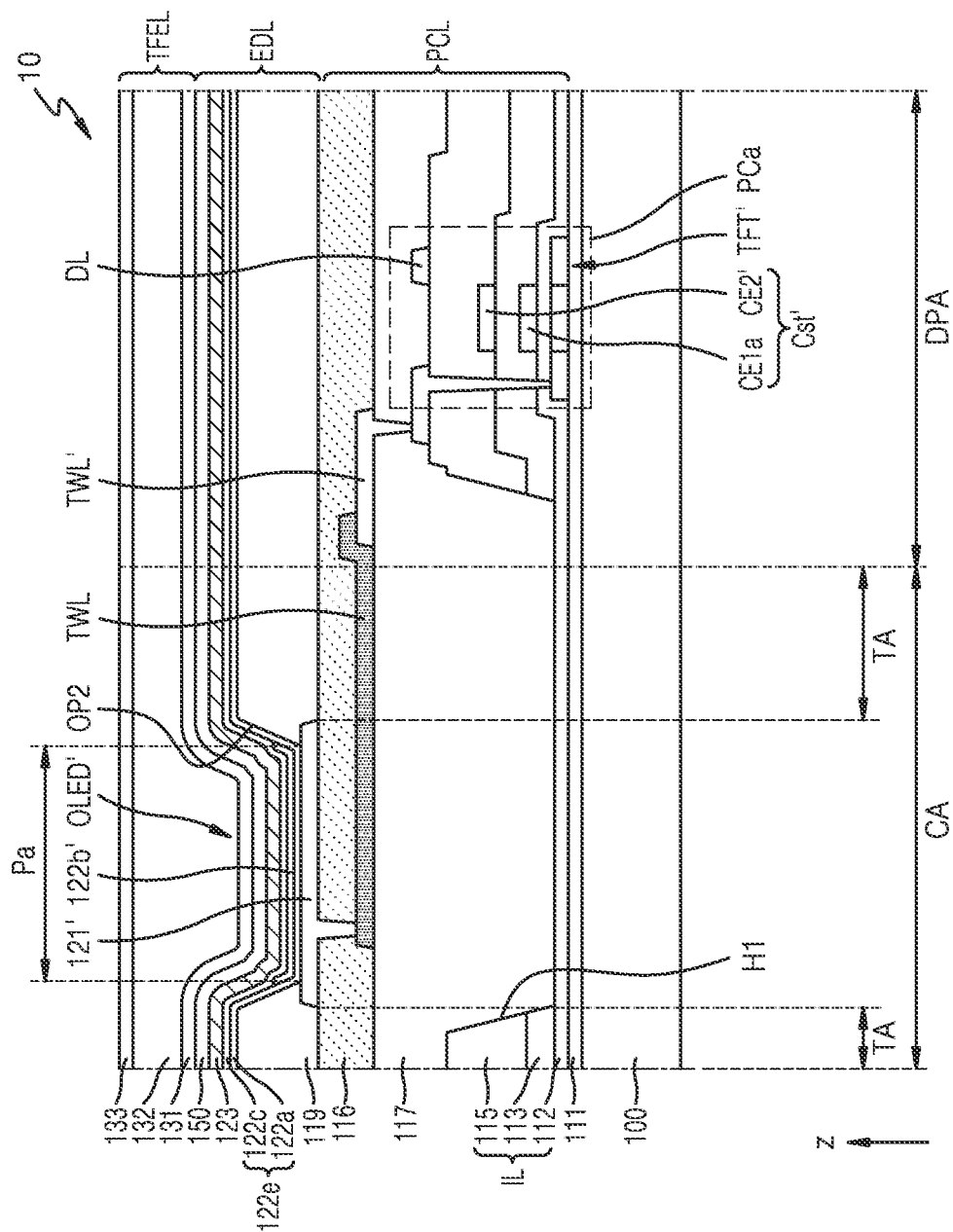
FIG. 9 is a cross-sectional view schematically illustrating part of a display panel according to some embodiments.

FIG. 9 is a cross-sectional view schematically illustrating part of a display panel according to some embodiments. In FIG. 9, the same reference symbols as those of FIG. 7 denote the same, and thus, redundant descriptions thereof will be omitted.

Referring to FIG. 9, the auxiliary organic light-emitting diode OLED' may be arranged as an auxiliary display element in the component area CA of the display panel 10, and the auxiliary pixel circuit PCa including the auxiliary thin-film transistor TFT' and the auxiliary storage capacitor Cst' may be arranged in the peripheral area DPA. Meanwhile, the transparent connection line TWL connecting the auxiliary pixel circuit PCa and the auxiliary organic light-emitting diode OLED' to each other may be arranged in the component area CA and the peripheral area DPA.

In the component area CA, a first organic insulating layer 116 and a second organic insulating layer 117 may be stacked between the substrate 100 and the auxiliary organic light-emitting diode OLED', and the first organic insulating layer 116 may be arranged on the transparent connection line TWL.

According to some embodiments, the second organic insulating layer 117 may be arranged under the transparent connection line TWL. The second organic insulating layer 117 may fill a hole or groove of the inorganic insulating layer IL, and may be provided on the entire surface of the substrate 100. The transparent connection line TWL may be arranged on an upper surface of the second organic insulating layer 117.

A light transmittance of the second organic insulating layer 117 may be greater than that of the first organic insulating layer 116. The second organic insulating layer 117 may be filled in the hole or groove of the inorganic insulating layer IL, and, in the component area CA, the volume per unit area of the second organic insulating layer 117 may be greater than the volume per unit area of the first organic insulating layer 116. Thus, a structure as shown in FIG. 9 may contribute to an improvement in light transmittance in the component area CA. In addition, the refractive index of the second organic insulating layer 117 may be less than the refractive index of the first organic insulating layer 116. Thus, a parasitic capacitance that may affect the auxiliary pixel circuit PCa may be minimized or relatively reduced.

Figure 10:
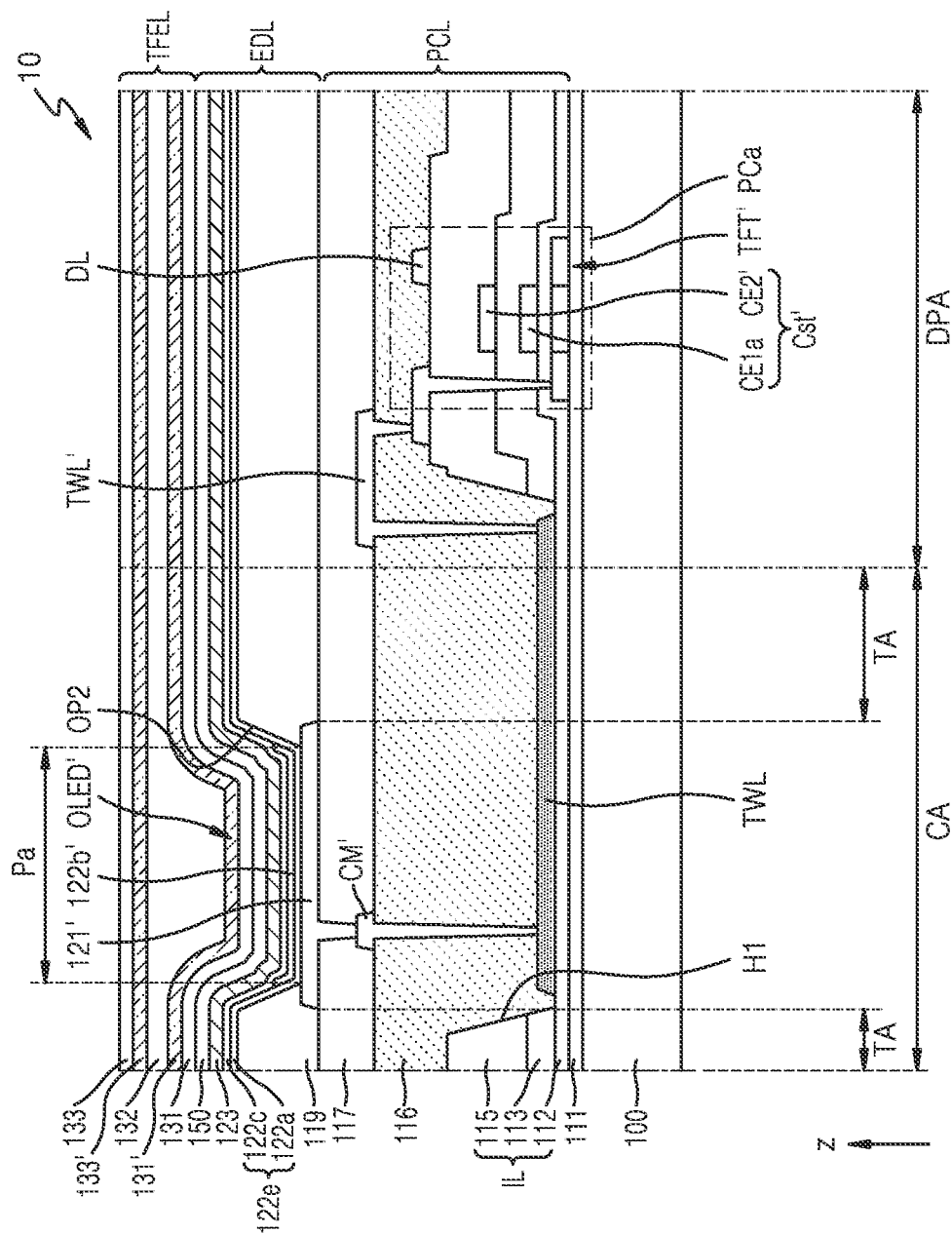
FIG. 10 is a cross-sectional view schematically illustrating part of a display panel according to some embodiments.

FIG. 10 is a cross-sectional view schematically illustrating part of a display panel 10 according to some embodiments. In FIG. 10, the same reference symbols as those of FIG. 7 denote the same, and thus, redundant descriptions thereof will be omitted.

Referring to FIG. 10, the auxiliary organic light-emitting diode OLED' may be arranged as an auxiliary display element in the component area CA of the display panel 10, and the auxiliary pixel circuit PCa including the auxiliary thin-film transistor TFT' and the auxiliary storage capacitor Cst' may be arranged in the peripheral area DPA. Meanwhile, the transparent connection line TWL connecting the auxiliary pixel circuit PCa and the auxiliary organic light-emitting diode OLED' to each other may be arranged in the component area CA and the peripheral area DPA.

In the component area CA, a first organic insulating layer 116 and a second organic insulating layer 117 may be stacked between the substrate 100 and the auxiliary organic light-emitting diode OLED', and the first organic insulating layer 116 may be arranged on the transparent connection line TWL.

According to some embodiments, the thin-film encapsulation layer TFEL may further include a first intermediate inorganic encapsulation layer 131' and/or a second intermediate inorganic encapsulation layer 133'. The first intermediate inorganic encapsulation layer 131' may be arranged between the first inorganic encapsulation layer 131 and the organic encapsulation layer 132. The second intermediate inorganic encapsulation layer 133' may be arranged between the second inorganic encapsulation layer 133 and the organic encapsulation layer 132.

Each of the first intermediate inorganic encapsulation layer 131' and the second intermediate inorganic encapsulation layer 133' may include silicon oxynitride ($SiO_xN_y$) ($x>0$, $y>0$). A refractive index of the first intermediate inorganic encapsulation layer 131' may have a value of between a refractive index of the first inorganic encapsulation layer 131 and a refractive index of the organic encapsulation layer 132. A refractive index of the second intermediate inorganic encapsulation layer 133' may have a value of between a refractive index of the second inorganic encapsulation layer 133 and the refractive index of the organic encapsulation layer 132.

Each of the first intermediate inorganic encapsulation layer 131' and the second intermediate inorganic encapsulation layer 133' may have a refractive index of about 1.6 to about 1.7. The refractive index value may be adjusted by changing a composition ratio of oxygen and nitrogen of silicon oxynitride ($SiO_xN_y$) ($x>0$, $y>0$) included in each of the first intermediate inorganic encapsulation layer 131' and the second intermediate inorganic encapsulation layer 133'. For example, when the amount of oxygen increases, the refractive index may decrease, and when the amount of nitrogen increases, the refractive index may increase.

In some embodiments, the first inorganic encapsulation layer 131 may include silicon oxynitride having a refractive index of about 1.7, and the organic encapsulation layer 132 may have a refractive index of about 1.5. In this case, the first intermediate inorganic encapsulation layer 131' may include silicon oxynitride ($SiO_xN_y$) ($x>0$, $y>0$) having a refractive index of about 1.62.

In some embodiments, the second inorganic encapsulation layer 133 may include silicon nitride ($SiN_x$) having a refractive index of about 1.9, and the organic encapsulation layer 132 may have a refractive index of about 1.5. In this case, the second intermediate inorganic encapsulation layer 133' may include silicon oxynitride ($SiO_xN_y$) ($x>0$, $y>0$) having a refractive index of about 1.68.

As a difference in refractive index between the stacked layers in the thin-film encapsulation layer TFEL increases, light reflection may occur at the interface, and thus, the light transmittance may decrease. According to some embodiments, by introducing the first intermediate inorganic encapsulation layer 131' and/or the second intermediate inorganic encapsulation layer 133', the light reflection at the interface may be minimized or relatively reduced. In the drawing, both the first intermediate inorganic encapsulation layer 131' and the second intermediate inorganic encapsulation layer 133' are shown, but the present disclosure is not limited thereto. For example, one of the first intermediate inorganic encapsulation layer 131' and the second intermediate inorganic encapsulation layer 133' may be omitted, and various modifications may be made.

Figure 11:
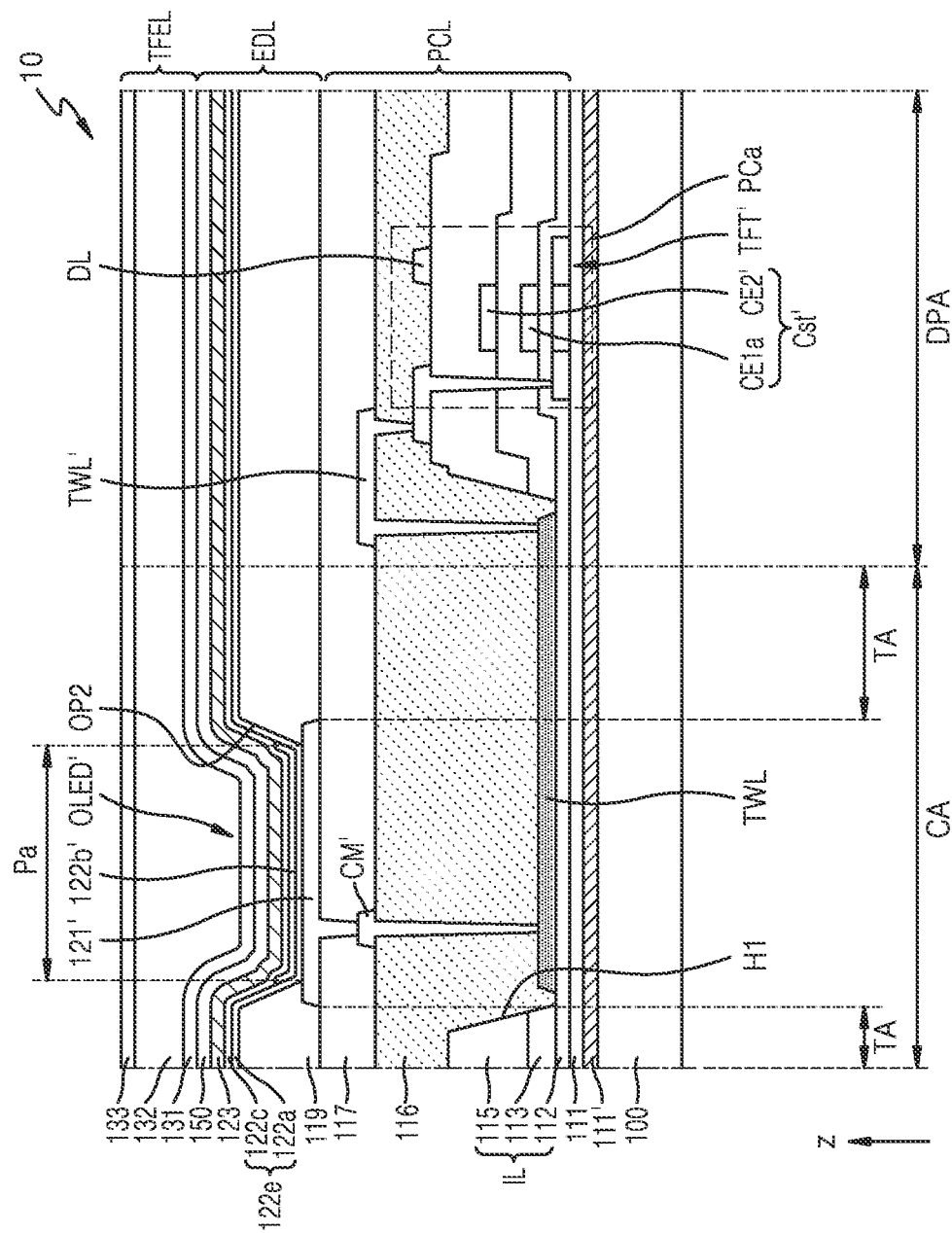
FIG. 11 is a cross-sectional view schematically illustrating part of a display panel according to some embodiments.

FIG. 11 is a cross-sectional view schematically illustrating part of a display panel 10 according to some embodiments. In FIG. 11, the same reference symbols as those of FIG. 7 denote the same, and thus, redundant descriptions thereof will be omitted.

Referring to FIG. 11, the auxiliary organic light-emitting diode OLED' may be arranged as an auxiliary display element in the component area CA of the display panel 10, and the auxiliary pixel circuit PCa including the auxiliary thin-film transistor TFT' and the auxiliary storage capacitor Cst' may be arranged in the peripheral area DPA. Meanwhile, the transparent connection line TWL connecting the auxiliary pixel circuit PCa and the auxiliary organic light-emitting diode OLED' to each other may be arranged in the component area CA and the peripheral area DPA.

In the component area CA, a first organic insulating layer 116 and a second organic insulating layer 117 may be stacked between the substrate 100 and the auxiliary organic light-emitting diode OLED', and the first organic insulating layer 116 may be arranged on the transparent connection line TWL.

According to some embodiments, a compensation layer 111' may be arranged between the substrate 100 and the buffer layer 111. The compensation layer 111' may have a refractive index less than that of the buffer layer 111. The compensation layer 111' may include silicon oxynitride ($SiO_xN_y$) ($x>0$, $y>0$). A refractive index of the compensation layer 111' may be adjusted between about 1.5 and about 1.8.

The substrate 100 may be provided by stacking a first organic layer, a first inorganic layer, a second organic layer, and a second inorganic layer, and the second inorganic layer arranged in the uppermost portion may include silicon oxide ($SiO_x$). Meanwhile, the buffer layer 111 may include silicon nitride ($SiN_x$). Because a difference in refractive index between silicon oxide ($SiO_x$) and silicon nitride ($SiN_x$) is large, light loss may occur due to light reflection at the interface.

According to some embodiments, by introducing the compensation layer 111' between the substrate 100 and the buffer layer 111, the light reflectance may be reduced. Thus, the light transmittance in the component area CA may be maximized or relatively increased.

Figure 12:
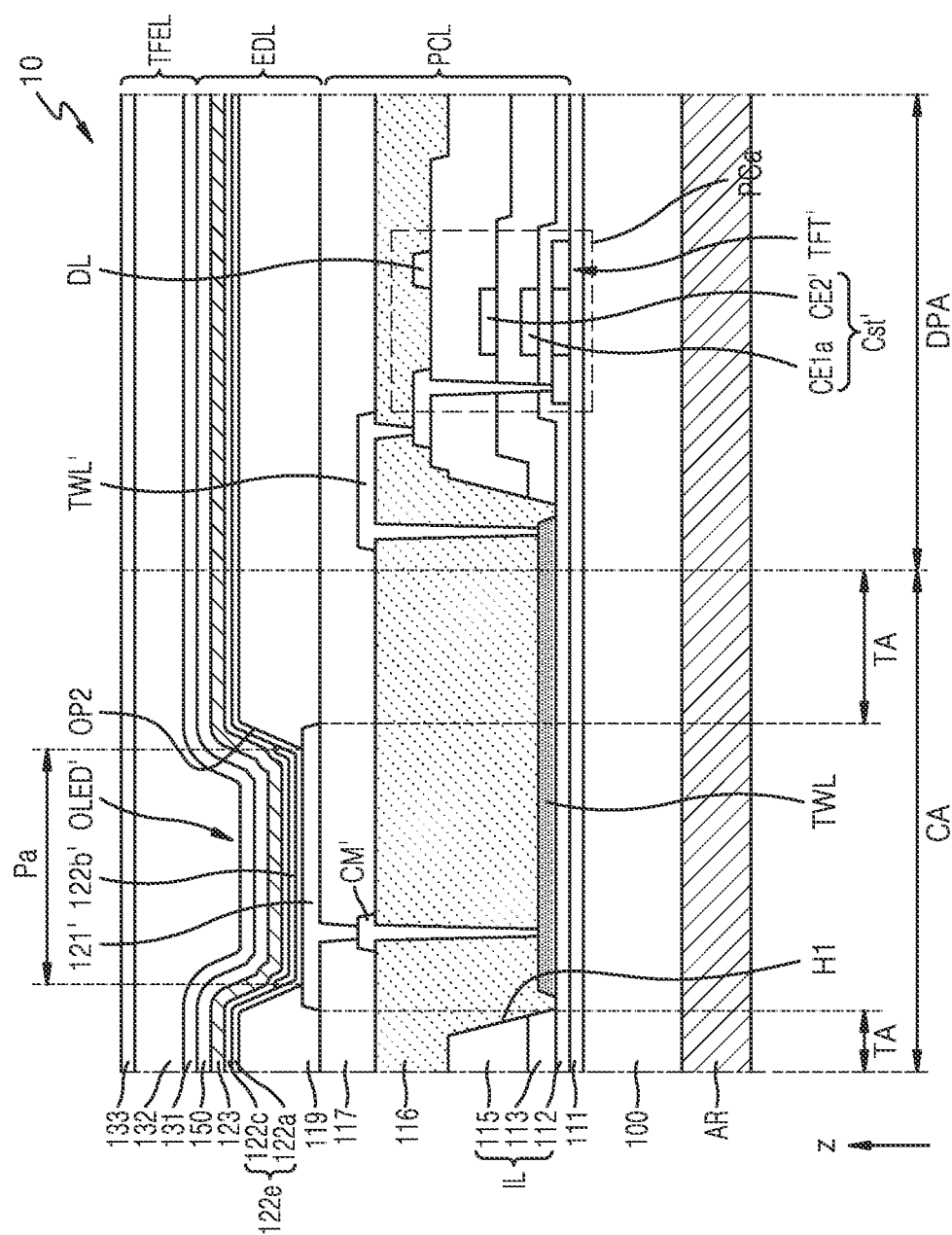
FIG. 12 is a cross-sectional view schematically illustrating part of a display panel according to some embodiments.

FIG. 12 is a cross-sectional view schematically illustrating part of a display panel 10 according to some embodiments. In FIG. 12, the same reference symbols as those of FIG. 7 denote the same, and thus, redundant descriptions thereof will be omitted.

Referring to FIG. 12, the auxiliary organic light-emitting diode OLED' may be arranged as an auxiliary display element in the component area CA of the display panel 10, and the auxiliary pixel circuit PCa including the auxiliary thin-film transistor TFT' and the auxiliary storage capacitor Cst' may be arranged in the peripheral area DPA. Meanwhile, the transparent connection line TWL connecting the auxiliary pixel circuit PCa and the auxiliary organic light-emitting diode OLED' to each other may be arranged in the component area CA and the peripheral area DPA.

In the component area CA, a first organic insulating layer 116 and a second organic insulating layer 117 may be stacked between the substrate 100 and the auxiliary organic light-emitting diode OLED', and the first organic insulating layer 116 may be arranged on the transparent connection line TWL.

According to some embodiments, an anti-reflection film AR may be arranged under the substrate 100. The anti-reflection film AR may be attached to a lower portion of the substrate 100 by an adhesive layer.

The anti-reflection film AR may include a light-transmitting substrate, a hard coating layer, and a low refractive index layer. The low refractive index layer may have a refractive index of about 1.2 to about 1.4 in a 550 nm wavelength area. As the anti-reflection film AR is provided, the light reflection that may occur at the lower interface of the substrate 100 may be minimized or relatively reduced, and thus, the light transmittance in the component area CA may be relatively improved.

Meanwhile, in the above-described embodiments, the first organic insulating layer 116 and the second organic insulating layer 117 include different materials, but the present disclosure is not limited thereto. According to some embodiments, the first organic insulating layer 116 and the second organic insulating layer 117 may include a same material. For example, the first organic insulating layer 116 and the second organic insulating layer 117 may each include a siloxane-based resin.

As described above, in the display panel and the display apparatus according to the present embodiments, no pixel circuits may be arranged in the component area, and thus, a wider transmission area may be secured, and thus, the transmittance may be improved.

However, the scope of the present disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display panel comprising:
   a substrate including a main display area, a component area, and an auxiliary pixel circuit area close to the component area;
   an auxiliary display element in the component area;
   an auxiliary pixel circuit in the auxiliary pixel circuit area and comprising an auxiliary thin-film transistor and an auxiliary storage capacitor;
   a transparent connection line connecting the auxiliary display element to the auxiliary pixel circuit;
   a bottom metal layer overlapping the auxiliary display element; and
   a first organic insulating layer disposed between the substrate and the auxiliary display element in the component area,
   wherein the first organic insulating layer is between the transparent connection line and the auxiliary display element, and
   the bottom metal layer is disposed between the substrate and the auxiliary display element.

2. The display panel of claim 1, further comprising a metal connection line connecting the transparent connection line to the auxiliary display element,
   wherein the metal connection line and the transparent connection line are on a same layer, and an end of the transparent connection line covers an end of the metal connection line.

3. The display panel of claim 1, further comprising a metal connection line connecting the transparent connection line to the auxiliary display element,
   wherein the metal connection line and an upper electrode of the auxiliary storage capacitor are on a same layer, and the transparent connection line is connected to the metal connection line via a contact hole.

4. The display panel of claim 1, further comprising a metal connection line connecting the transparent connection line and the auxiliary display element to each other,
   wherein the metal connection line and a lower electrode of the auxiliary storage capacitor are on a same layer, and the transparent connection line is connected to the metal connection line via a contact hole.

5. The display panel of claim 1, further comprising an inorganic insulating layer on the substrate,
   wherein the inorganic insulating layer comprises a hole or groove corresponding to the component area.

6. The display panel of claim 5, wherein the transparent connection line is inside the hole or groove of the inorganic insulating layer, and
   the first organic insulating layer fills the hole or groove of the inorganic insulating layer and is on an entire surface of the substrate.

7. The display panel of claim 6, further comprising a metal connection line connecting the transparent connection line to the auxiliary display element,
   wherein the metal connection line is on the first organic insulating layer, and the transparent connection line is connected to the metal connection line via a contact hole.

8. The display panel of claim 1, further comprising a second organic insulating layer disposed between the first organic insulating layer and the auxiliary display element in the component area, wherein and a refractive index of the first organic insulating layer is between a refractive index of the transparent connection line and a refractive index of the second organic insulating layer.

9. The display panel of claim 8, wherein the refractive index of the first organic insulating layer is greater than the refractive index of the second organic insulating layer.

10. The display panel of claim 1, wherein a difference between a refractive index of the transparent connection line and a refractive index of the first organic insulating layer is 0.45 or less.

11. A display apparatus comprising:
    a display panel comprising a main display area including a plurality of main sub-pixels, a component area including a plurality of sub-pixels, and an auxiliary pixel circuit area close to the component area; and
    a component at the component area below the display panel, wherein the display panel comprises:
    a substrate;
    an auxiliary display element in the component area;
    an auxiliary pixel circuit in the auxiliary pixel circuit area and comprising an auxiliary thin-film transistor and an auxiliary storage capacitor;
    a transparent connection line connecting the auxiliary display element to the auxiliary pixel circuit;
    a bottom metal layer overlapping the auxiliary display element; and a first organic insulating layer disposed between the substrate and the auxiliary display element in the component area,
wherein the first organic insulating layer is between the transparent connection line and the auxiliary display element, and
the bottom metal layer is disposed between the substrate and the auxiliary display element.

12. The display apparatus of claim 11, further comprising a metal connection line connecting the transparent connection line to the auxiliary display element,
wherein the metal connection line and the transparent connection line are on a same layer, and an end of the transparent connection line covers an end of the metal connection line.

13. The display apparatus of claim 11, further comprising a metal connection line connecting the transparent connection line to the auxiliary display element,
wherein the metal connection line and an upper electrode of the auxiliary storage capacitor are on a same layer, and the transparent connection line is connected to the metal connection line via a contact hole.

14. The display apparatus of claim 11, further comprising a metal connection line connecting the transparent connection line and the auxiliary display element to each other,
wherein the metal connection line and a lower electrode of the auxiliary storage capacitor are on a same layer, and the transparent connection line is connected to the metal connection line via a contact hole.

15. The display apparatus of claim 11, further comprising an inorganic insulating layer on the substrate,
wherein the inorganic insulating layer comprises a hole or groove corresponding to the component area.

16. The display apparatus of claim 15, wherein the transparent connection line is inside the hole or groove of the inorganic insulating layer, and
the first organic insulating layer fills the hole or groove of the inorganic insulating layer and is on an entire surface of the substrate.

17. The display apparatus of claim 16, further comprising a metal connection line connecting the transparent connection line to the auxiliary display element,
wherein the metal connection line is on the first organic insulating layer, and the transparent connection line is connected to the metal connection line via a contact hole.

18. The display apparatus of claim 11, further comprising a second organic insulating layer disposed between the first organic insulating layer and the auxiliary display element in the component area, wherein and a refractive index of the first organic insulating layer is between a refractive index of the transparent connection line and a refractive index of the second organic insulating layer.

19. The display apparatus of claim 18, wherein the refractive index of the first organic insulating layer is greater than the refractive index of the second organic insulating layer.

20. The display apparatus of claim 11, wherein the component includes an image pickup device.

* * * * *